United States Patent
Park et al.

(10) Patent No.: US 9,048,354 B2
(45) Date of Patent: Jun. 2, 2015

(54) METHODS OF FORMING A THROUGH VIA STRUCTURE

(71) Applicants: Byung-Jun Park, Hwaseong-si (KR); Seung-Hun Shin, Suwon-si (KR)

(72) Inventors: Byung-Jun Park, Hwaseong-si (KR); Seung-Hun Shin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 13/803,821

(22) Filed: Mar. 14, 2013

(65) Prior Publication Data

US 2013/0323875 A1 Dec. 5, 2013

(30) Foreign Application Priority Data

May 30, 2012 (KR) ........................ 10-2012-0057470

(51) Int. Cl.
| | |
|---|---|
| H01L 21/00 | (2006.01) |
| H01L 31/0224 | (2006.01) |
| H01L 21/768 | (2006.01) |
| H01L 27/146 | (2006.01) |
| H01L 23/48 | (2006.01) |

(52) U.S. Cl.
CPC .. *H01L 31/022408* (2013.01); *H01L 21/76898* (2013.01); *H01L 27/14636* (2013.01); *H01L 27/1464* (2013.01); *H01L 27/14689* (2013.01); *H01L 23/481* (2013.01); *H01L 2924/0002* (2013.01)

(58) Field of Classification Search
CPC .............. H01L 21/04; H01L 21/26513; H01L 27/11556; H01L 27/11582; H01L 29/42384; H01L 29/66477; H01L 29/66742; H01L 29/6675; H01L 29/66787; H01L 29/785; H01L 29/78642; H01L 29/78696; H01L 29/7926

USPC ............ 438/70, 430; 257/522, 774, 621–622, 257/E23.142, E25.18
See application file for complete search history.

(56) References Cited

U.S. PATENT DOCUMENTS

| | | |
|---|---|---|
| 2005/0104148 A1 | 5/2005 | Yamamoto et al. |
| 2009/0085143 A1 | 4/2009 | Park |
| 2009/0140365 A1 | 6/2009 | Lee et al. |
| 2009/0146148 A1 | 6/2009 | Pyo |
| 2010/0155796 A1 | 6/2010 | Koike et al. |
| 2010/0207226 A1 | 8/2010 | Park et al. |
| 2010/0230773 A1 | 9/2010 | Nakazawa et al. |
| 2010/0244175 A1 | 9/2010 | Park |
| 2011/0084350 A1 | 4/2011 | Murakoshi et al. |
| 2011/0186951 A1 | 8/2011 | Pyo |

FOREIGN PATENT DOCUMENTS

| | | |
|---|---|---|
| KR | 1020090033636 A | 4/2009 |
| KR | 1020110037481 A | 4/2011 |
| KR | 1020110050091 A | 5/2011 |

*Primary Examiner* — Mark A Laurenzi
(74) *Attorney, Agent, or Firm* — Myers Bigel Sibley & Sajovec, P.A.

(57) ABSTRACT

Methods of manufacturing an integrated circuit device including a through via structure are provided. The methods may include forming an isolation trench through a substrate to form an inner substrate, which is enclosed by the isolation trench and forming an insulating layer in the isolation trench and on a surface of the substrate. The methods may also include forming a hole, which is spaced apart from the isolation trench and passes through a portion of the insulating layer formed on the surface of the substrate and the inner substrate and forming a conductive layer in the hole and on the insulating layer formed on the surface of the substrate. The methods may be used to manufacture image sensors.

30 Claims, 25 Drawing Sheets

METHODS OF FORMING A THROUGH VIA STRUCTURE

CROSS-REFERENCE TO RELATED APPLICATION

This U.S. non-provisional patent application claims priority under 35 U.S.C §119 to Korean Patent Application No. 10-2012-0057470, filed on May 30, 2012, in the Korean Intellectual Property Office (KIPO), the disclosure of which is hereby incorporated by reference in its entirety.

FIELD

The present disclosure generally relates to the field of electronics, and more particular to semiconductor devices.

BACKGROUND

Three dimensional package technologies, including TSV (through silicon via) technologies, may be used for high density devices. Backside illumination image sensors may be used to improve the light receiving efficiency and light sensitivity of pixels included in the image sensor. Both devices including TSV or backside illumination image sensors may include a through via structure passing through a substrate to connect conductive patterns disposed on both sides of the substrate.

SUMMARY

A method of forming a through silicon via structure may include forming an insulating interlayer structure including an insulating interlayer on a first side of a semiconductor layer and an internal wiring on the insulating interlayer. The method may also include forming an outer semiconductor pattern and an inner semiconductor pattern isolated from the outer semiconductor pattern by forming an isolation trench through the semiconductor layer. The isolation trench may enclose the inner semiconductor pattern and expose the insulating interlayer. The method may further include forming an insulating pattern covering a second side of the semiconductor layer opposite to the first side of the semiconductor layer and an inner surface of the isolation trench. Additionally, the method may include forming a via hole, which may be spaced apart from the isolation trench and pass through the inner semiconductor pattern and forming a through silicon via contact in the via hole contacting the internal wiring. An upper portion of the via hole may be surrounded by a portion of the insulating pattern covering the second side of the semiconductor layer.

In various embodiments, forming the isolation trench may include etching a portion of the insulating interlayer to dispose a lower portion of the isolation trench in the insulating interlayer.

According to various embodiments, the method may include forming a pad pattern after forming the through silicon via contact and the pad pattern may contact a portion of the insulating pattern covering the second side of the semiconductor layer.

A method of manufacturing an image sensor may include forming a first photodiode for an active pixel and a second photodiode for an optical black pixel in first and second regions of a semiconductor layer, respectively and forming an insulating interlayer structure including an insulating interlayer on a first side of the semiconductor layer and an internal wiring on the insulating interlayer. The method may also include forming an outer semiconductor pattern and an inner semiconductor pattern isolated from the outer semiconductor pattern by forming an isolation trench through the semiconductor layer. The isolation trench may enclose the inner semiconductor pattern and expose the insulating interlayer. The method may further include forming an insulating pattern covering a second side of the semiconductor layer opposite to the first side of the semiconductor layer and an inner surface of the isolation trench. Additionally, the method may include forming a through silicon via contact, which may be spaced apart from the isolation trench and pass through the inner semiconductor pattern, forming a pad pattern on the insulating pattern covering the second side of the semiconductor layer and forming a color filter on the insulating pattern covering the second side of the semiconductor layer and a micro lens on the color filter. An upper portion of the through silicon via contact may be surrounded by a portion of the insulating pattern covering the second side of the semiconductor layer and a lower portion of the through silicon via contact contacts the internal wiring.

In various embodiments, the forming the through silicon via contact and forming the pad pattern may include forming a via hole spaced apart from the isolation trench by etching through the inner semiconductor pattern and a portion of the insulating pattern covering the second side of the semiconductor layer, forming a conductive layer in the via hole and on the insulating pattern covering the second side of the semiconductor layer, forming the through silicon via including the conductive layer and forming the pad pattern by patterning the conductive layer, which may include the pad pattern. The via hole may expose the internal wiring.

According to various embodiments, the method may include forming a light blocking pattern on the insulating pattern in the second region of the semiconductor layer by patterning the conductive layer that the light blocking pattern may include.

In various embodiments, forming the conductive layer may include forming a stack structure including a first metal layer and a second metal layer, which may have an etch selectivity to the first metal layer.

According to various embodiments, wherein forming the through silicon via contact may include forming the through silicon via contact including the stack structure, forming the pad pattern may include forming the pad pattern including the stack structure and forming the light blocking pattern may include forming the light blocking pattern consisting of the first metal layer.

In various embodiments, the first photodiode may be one among a plurality of first photodiodes and the method further may also include forming an optical crosstalk prevention pattern extending on the insulating pattern and between directly adjacent two of the plurality of first photodiodes, the optical crosstalk prevention pattern may include the conductive layer.

According to various embodiments, the semiconductor layer may include a peripheral circuit region including a plurality of transistors in the outer semiconductor pattern and a pad region including the inner semiconductor pattern. The method may further include forming a trench in one of a first portion of the semiconductor layer between the first region and the second region, a second portion of the semiconductor layer in the peripheral circuit region and a third portion of the semiconductor layer in the pad region and forming a trench insulating layer in the trench.

A method of manufacturing an integrated circuit device may include forming an insulating interlayer structure on a first surface of a substrate. The insulating interlayer structure may include an insulating interlayer and an internal wiring. The method may also include forming an isolation trench through the substrate to form an inner substrate, which may be enclosed by the isolation trench, and forming an insulating layer in the isolation trench and on a second surface of the substrate, which is opposite to the first surface of the substrate. The method further include forming a hole, which may be spaced apart from the isolation trench and pass through a portion of the insulating layer formed on the second surface of the substrate and the inner substrate. The hole may expose the internal wiring. Moreover, the method may include forming a conductive layer in the hole and on the insulating layer formed on the second surface of the substrate.

In various embodiments, forming the insulating layer may include forming a portion of the insulating layer extending between the second surface of the substrate and the conductive layer formed on the second surface of the substrate.

According to various embodiments, forming the conductive layer may include forming a portion of the conductive layer directly contacting the inner substrate in the hole.

In various embodiments, forming the insulating layer may include forming the insulating layer conformally on an inner surface of the isolation trench.

According to various embodiments, forming the conductive layer may include forming the conductive layer on the insulating layer in the isolation trench.

In various embodiments, forming the insulating layer may include forming a void in the isolation trench by forming the insulating layer plugging an opening of the isolation trench defined by the second surface of the substrate.

According to various embodiments, forming the isolation trench may include forming a lower portion of the isolation trench surrounded by the insulating interlayer.

In various embodiments, the method additionally may include forming a pad pattern after forming the conductive layer. The pad pattern may include the conductive layer and may contact the insulating layer formed on the second surface of the substrate.

According to various embodiments, the method also include forming a first photodiode for an active pixel in a first region of the substrate, which is outside of the inner substrate, forming a pad pattern on the insulating layer formed on the second surface of the substrate and forming a first color filter on the insulating layer formed on the first photodiode and a first micro lens on the first color filter.

In various embodiments, forming the insulating layer may include forming an anti-reflective layer and forming an upper insulating layer on the anti-reflective layer.

According to various embodiments, forming the pad pattern may include forming an upper conductive layer on the conductive layer. The upper conductive layer may have etch selectivity to the conductive layer.

In various embodiments, forming the upper conductive layer may include forming the upper conductive layer having resistance lower than that of the conductive layer.

According to various embodiments, the method may include forming a second photodiode for an optical black pixel in a second region of the substrate, which is outside of the inner substrate, forming a second color filter on the insulating layer formed on the second photodiode and a second micro lens on the second color filter, and forming a light blocking pattern between the second color filter and the insulating layer formed on the second photodiode.

In various embodiments, forming the light blocking pattern may include patterning the conductive layer that the light blocking pattern may include.

According to various embodiments, forming the light blocking pattern may include forming the light blocking pattern thinner than the pad pattern.

In various embodiments, the first photodiode may be one among a plurality of first photodiodes and the method may further include forming an optical crosstalk preventing pattern extending on the insulating layer and between directly adjacent ones of the plurality of first photodiodes.

According to various embodiments, forming the optical crosstalk preventing pattern may include pattering the conductive layer that the optical crosstalk preventing pattern may include.

In various embodiments, the substrate may include a peripheral circuit region including a plurality of transistors and a pad region including the inner substrate. The method may still further include forming a second photodiode for an optical black pixel in a second region of the substrate, forming a trench in one of a first portion of the substrate between the first region and the second region, a second portion of the substrate in the peripheral circuit region and a third portion of the substrate in the pad region, which is outside of the inner substrate and forming a trench insulating layer in the trench.

According to various embodiments, the trench may include forming the trench through the substrate.

In various embodiments, forming the trench insulating layer may include forming the trench insulating layer including the insulating layer.

DETAILED DESCRIPTION OF THE EMBODIMENTS

Figure 1:
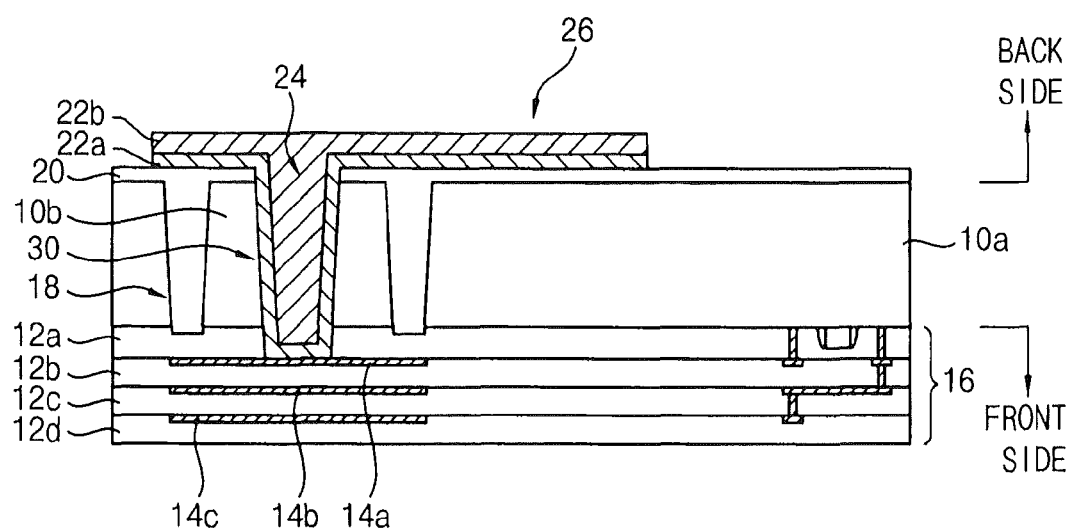
FIG. 1 is a sectional view illustrating a through silicon via structure in accordance with some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise.

It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIG. 1 is a sectional view illustrating a through silicon via structure in accordance with some embodiments.

Referring to FIG. 1, a semiconductor layer including a single crystalline semiconductor material may be provided. The semiconductor layer may be formed by polishing a single crystalline semiconductor substrate until the single crystalline semiconductor substrate has a thickness of a few μm to several tens of μm. Alternatively, the semiconductor layer may be a single crystalline semiconductor layer formed through an epitaxial growth process. The semiconductor layer may have a first side and a second side opposite to the first side. The first side may be a front side of the semiconductor layer for forming circuit patterns. The second side may be a back side of the semiconductor layer.

An insulating interlayer structure 16 including transistors, insulating interlayers 12a to 12d and internal wirings 14a to 14c may be provided on the front side of the semiconductor layer. The insulating interlayers 12a to 12d and internal wirings 14a to 14c may be stacked as a multi-layer structure. An isolation trench 18 may be formed through the semiconductor layer from the backside of the semiconductor layer to expose the insulating interlayer structure 16. A bottom surface of the isolation trench 18 may be lower than the front side of the semiconductor layer. When viewed from the top, the isolation trench 18 may have an annular shape. The semiconductor layer may be divided by the isolation trench 18 into an inner semiconductor pattern 10b and an outer semiconductor pattern 10a. The isolation trench 18 may enclose the inner semiconductor pattern 10b and may dispose the outer semiconductor pattern 10a outside of the isolation trench 18. The inner semiconductor pattern 10b may be isolated from the outer semiconductor pattern 10a by the isolation trench 18.

The sidewall of the isolation trench 18 may be inclined such that the width of the isolation trench 18 may be gradually narrowed in the downward direction from the backside of the semiconductor layer. The sidewall of the isolation trench 18 may be vertical.

An insulating pattern 20 may be formed in the isolation trench 18 while covering an entire surface of the backside of the semiconductor layer. In some embodiments, the insulating pattern 20 may completely fill up the isolation trench 18. The insulating pattern 20 may be formed by using a single insulating material or at least two insulating materials.

The insulating pattern 20 formed in the isolation trench 18 may serve as an isolation pattern that electrically isolates a through silicon via contact 24 from the outer semiconductor pattern 10a. In addition, the insulating pattern 20 covering the entire surface of the backside of the semiconductor layer may serve as an insulating interlayer that insulates the semiconductor layer from a pad pattern 26.

The through silicon via contact 24 may be formed in the inner semiconductor pattern 10b after forming the isolation trench 18 and the through silicon via contact 24 may be spaced apart from the isolation trench 18. The through silicon via contact 24 may be formed through a portion of the insulating pattern 20 formed on the surface of the backside of the semiconductor layer and through the inner semiconductor pattern 10b. An upper portion of the through silicon via contact 24 may be surrounded by a portion of the insulating pattern 20 covering the surface of the backside of the semiconductor layer. A bottom surface of the through silicon via contact 24 may contact the internal wirings 14a, 14b and 14c of the insulating interlayer structure. In addition, the bottom surface of the through silicon via contact 24 may be below the bottom surface of the isolation trench 18 and a lower portion of the through silicon via contact 24 may be surrounded by the insulating interlayers 12a to 12d.

The sidewall of the through silicon via contact 24 may directly contact the inner semiconductor pattern 10b. The through silicon via contact 24 may be formed by stacking first and second conductive layers 22a and 22b including different materials. The first and second conductive layers 22a and 22b may include metals. A portion of the insulating pattern 20 formed on the surface of the backside of the semiconductor layer may be disposed between the first conductive layer 22a and the backside of the semiconductor layer.

The through silicon via contact 24 may be formed in a the via hole 30 formed through the inner semiconductor pattern 10b. The via hole 30 may be completely fill with the first and second conductive layers 22a and 22b. In some embodiments, the first and second conductive layers 22a and 22b may be conformally formed on an inner surface of the via hole 30 while not completely filling up the via hole.

The pad pattern 26 may extend from the through silicon via contact 24 and may contact the surface of the insulating pattern 20 disposed at the backside of the semiconductor layer. The pad pattern 26 and the through silicon via contact 24 may include an identical conductive material.

In the through silicon via contact structure, the insulating spacer is not provided on the sidewall of the through silicon via contact 24. Accordingly, the sidewall of the through silicon via contact 24 directly contacts with the silicon layer. Thus, the problems that may occur during the process of forming the insulating spacer, such as contact not-open or high contact resistance, can be reduced.

FIGS. 2A to 2D are sectional views illustrating a method of forming the through silicon via structure illustrated in FIG. 1.

Figure 2A:
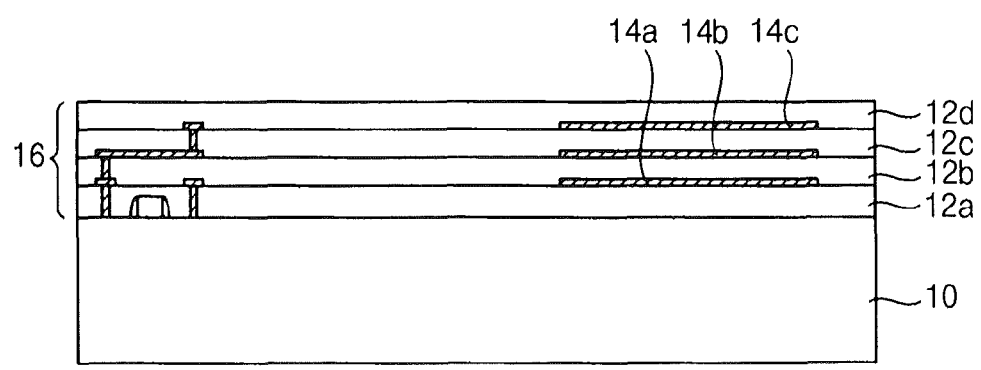
FIGS. 2A to 2D are sectional views illustrating a method of forming the through silicon via structure illustrated in FIG. 1.

Referring to FIG. 2A, transistors may be formed on the front side of the single crystalline semiconductor substrate 10. The insulating interlayer structure 16 including the insulating interlayers 12a to 12d and the internal wirings 14a to 14c may be formed on the semiconductor substrate 10 having the transistors. The insulating interlayer structure 16 may have a flat surface.

Figure 2B:
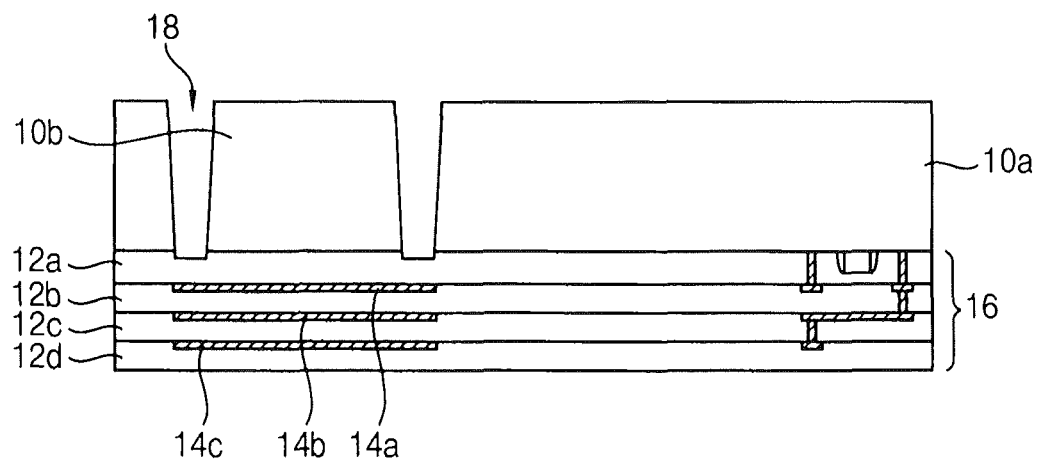

Referring to FIG. 2B, a support substrate may be bonded to the surface of the insulating interlayer structure 16. Then, the semiconductor layer may be formed by grinding the backside of the semiconductor substrate 10. The semiconductor layer may be polished such that the semiconductor layer may have a thickness of a few μm to several tens of μm.

A first etching mask pattern to form the isolation trench 18 may be formed on the semiconductor layer. Then, the isolation trench 18 may be formed by etching the semiconductor layer using the first etching mask pattern as an etching mask. An outer semiconductor pattern 10a and an inner semiconductor pattern 10b isolated from the outer semiconductor pattern 10a may be formed by the etching process. The isolation trench 18 may have an annular shape surrounding a region where the through silicon via contact will be formed.

The insulting interlayer 12a included in the insulating interlayer structure 16 may be exposed in the bottom of the isolation trench 18. The etching process may be carried out such that the bottom surface of the isolation trench 18 may be lower than the front side of the semiconductor layer. In addition, the internal wirings 14a to 14c may not be exposed to the inner wall and the bottom surface of the isolation trench 18. The isolation trench 18 may electrically isolate the outer semiconductor pattern 10a from the through silicon via contact formed in the subsequent process.

Figure 2C:
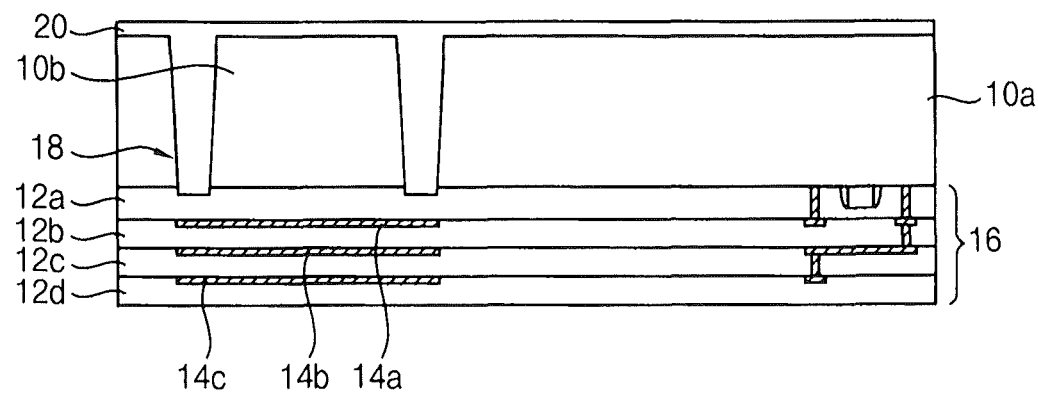

Referring to FIG. 2C, the insulating pattern 20 may be formed in the isolation trench 18 while covering the entire surface of the backside of the semiconductor layer. The insulating pattern 20 may be formed by using a single insulating material, two insulating materials or more. The insulating pattern 20 may be formed by using oxide, such as silicon oxide or metal oxide, or nitride, such as silicon nitride.

Figure 2D:
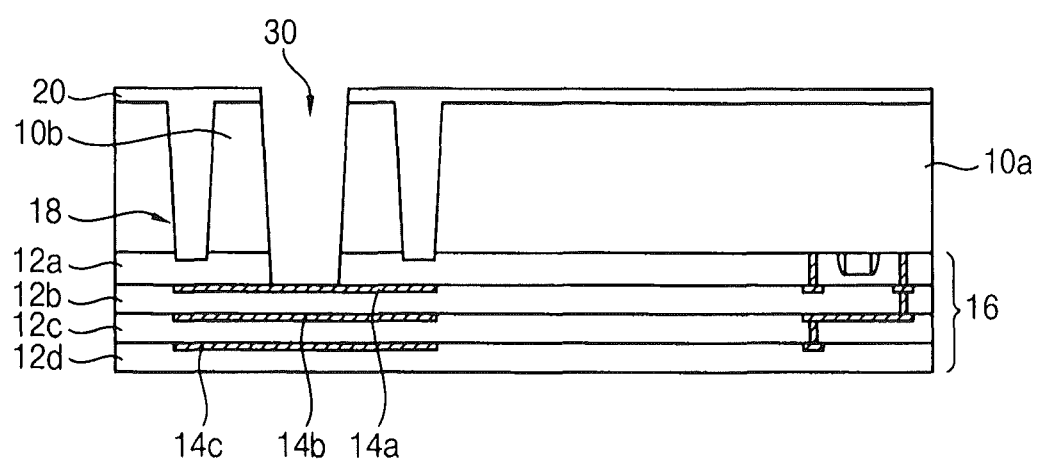

Referring to FIG. 2D, a second etching mask pattern to form the via hole may be formed on the insulating pattern 20. The insulating pattern 20, the inner semiconductor pattern 10b and the insulating interlayer structure 16 may be sequentially etched using the second etching mask pattern to form the via hole 30 and the internal wiring 14a may be exposed in the bottom of the via hole 30. The via hole 30 may be formed through the semiconductor layer enclosed by the isolation trench 18 while being spaced apart from the isolation trench 18.

Referring again to FIG. 1, a conductive layer may be formed in the via hole 30 and on the top surface of the insulating pattern 20. The conductive layer may include a barrier metal and a metal layer. As the conductive layer is formed, the through silicon via contact 24 may be formed in the via hole 30.

The pad pattern 26, which is disposed on the insulating pattern 20 and connected to the through silicon via contact 24, may be formed by patterning the conductive layer. The pad pattern 26 and the through silicon via contact 24 may include an identical material.

Figure 3:
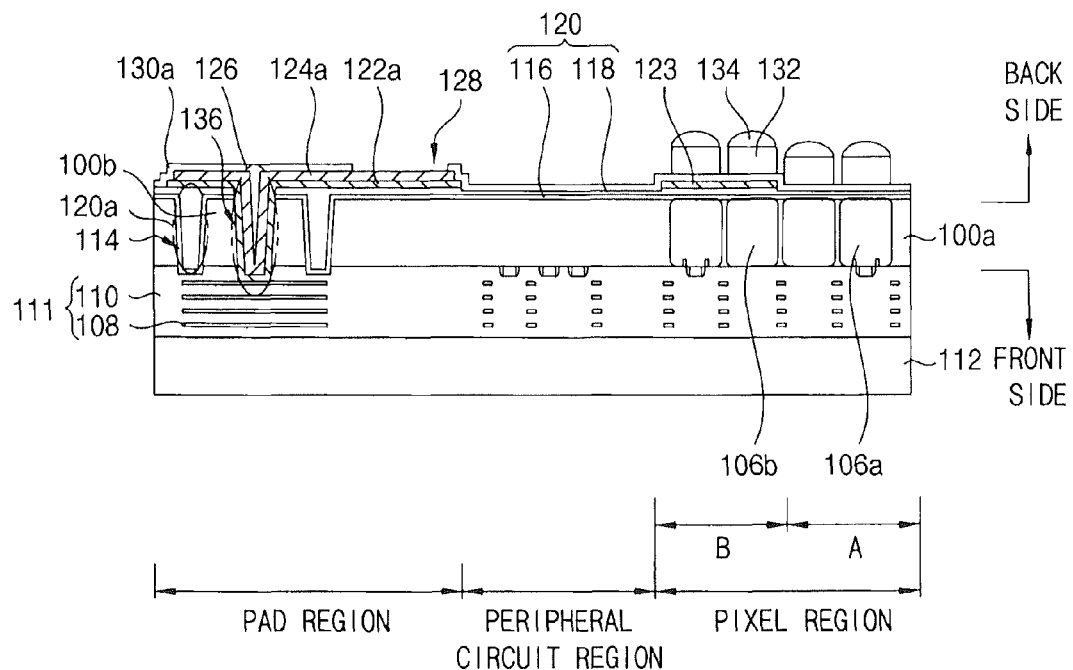
FIG. 3 is a sectional view illustrating a backside illumination image sensor in accordance with some embodiments.

FIG. 3 is a sectional view illustrating the backside illumination image sensor in accordance with some embodiments.

Referring to FIG. 3, a semiconductor layer 100a, 100b having a first side and a second side opposite to the first side may be provided. The first side may be a front side of the semiconductor layer 100a, 100b for forming unit devices. The second side may be a back side of the semiconductor layer 100a, 100b to be illuminated. The semiconductor layer 100a, 100b may be a single crystalline semiconductor layer formed through an epitaxial growth process. The semiconductor layer 100a, 100b may be formed by polishing the single crystalline semiconductor substrate until the single crystalline semiconductor substrate has a thickness of a few μm to several tens of μm.

The semiconductor layer 100a, 100b may include a pixel region, a peripheral circuit region and a pad region. The pixel region may include an active pixel region A and an optical black region B.

The active pixel region A may include a unit pixel array which generates image signals by performing photoelectric conversion with respect to incident light. The optical black region B may include optical black pixels which may not generate charges by incident light. In general, a unit pixel may generate charges by incident light as well as by heat. Thus, a unit pixel array may adopt an auto dark level compensation technology which subtracts charges generated by heat from total charges in order to precisely measure the charges generated by the incident light. To this end, the optical black pixel may be provided. The peripheral circuit region may include a logic circuit, which processes and outputs image signals generated from the unit pixel array. The pad region may include pad patterns electrically connected to internal patterns.

Transistors may be provided on the front side of the semiconductor layer 100a, 100b. A transfer transistor, a reset transistor, a switch transistor and a select transistor may be included in each unit pixel in the pixel region. In addition, transistors constituting peripheral circuits may be provided in the peripheral circuit region.

An insulating interlayer structure 111 including an insulating interlayer 110 and internal wirings 108 may be provided on the front side of the semiconductor layer 100a, 100b. The insulating interlayer 110 and internal wirings 108 may be stacked in a multi-layer structure. Since the internal wirings 108 are disposed on the front side of the semiconductor layer 100a, 100b, which is opposite to an incident surface, the internal wirings 108 may not exert influence upon the light efficiency and light sensitivity. Thus, the internal wirings 108 may be aligned regardless of the position of photodiodes 106a and 106b.

A support substrate 112 may be provided on a surface of the insulating interlayer structure 111, which is opposite to a surface making contact with the semiconductor layer 100a, 100b.

The photodiodes 106a and 106b may be provided in the pixel region of the semiconductor layer 100a, 100b. First photodiodes 106a may be provided in the active pixel region A and second photodiodes 106b may be provided in the optical black region B. For instance, the first and second photodiodes 106a and 106b may be formed by implanting n type ions into a p type epitaxial layer.

An isolation trench 114 may be formed through the semiconductor layer 100a, 100b from the backside of the semiconductor layer 100a, 100b to expose the insulating interlayer structure 111. When viewed from the top, the isolation trench 114 may have an annular shape. The isolation trench 114 may expose the insulting interlayer 110 included in the insulating interlayer structure 111 without exposing the internal wirings 108.

The isolation trench 114 may separate an inner semiconductor pattern 100b from an outer semiconductor pattern 100a. The semiconductor layer 100a, 100b includes the outer semiconductor pattern 100a and the inner semiconductor pattern 100b electrically isolated by the isolation trench 114 from the outer semiconductor pattern 100a. The isolation trench 114 may enclose the inner semiconductor pattern 100b and dispose the outer semiconductor pattern 100a outside of the inner semiconductor pattern 100b.

An insulating pattern 120 may be formed in the isolation trench 114 while covering an entire surface of the backside of the semiconductor layer 100a, 100b. The insulating pattern 120 may include an anti-reflective layer 116 and an insulating layer 118. The anti-reflective layer 116 may include an insulating material having high transmittance. The anti-reflective layer 116 may include metal oxide, such as hafnium oxide. The insulating layer 118 may include silicon oxide or silicon nitride. The insulating layer 118 may be an optional element and may be omitted. In this case, the insulating pattern 120 may include only the anti-reflective layer 116.

The insulating pattern 120 may have a thickness in the range of 300 Å to 2000 Å. The insulating pattern 120 thinner than 300 Å may be consumed during the process and a portion of the semiconductor layer 100a, 100b may be not covered by the insulating pattern 120. The insulating pattern 120 thicker than 2000 Å may make a portion of the pixel region be protruded from remaining portion of the pixel region.

The insulating pattern 120 filled in the isolation trench 114 may serve as an isolation pattern 120a that electrically insulates a through silicon via contact 126 from the outer semiconductor pattern 100a.

The through silicon via contact 126 may be formed through the inner semiconductor pattern 100b, which is disposed in the isolation trench 114 having the annular shape, and spaced apart from the isolation trench 114. The through silicon via contact 126 may contact with the internal wirings 108 of the insulating interlayer structure by passing through the inner semiconductor pattern 100b.

The through silicon via contact 126 may be formed by stacking first and second metal layers 122a and 124a in a via hole 136. The first and second metal layers 122a and 124a may completely fill up the via hole 136. In some embodiments, first and second metal layers 122a and 124a may be formed along the profile of the sidewall and the bottom surface of the via hole 136 without completely filling up the via hole 136.

The first metal layer 122a may be formed by stacking an ohmic layer, a first main metal layer and a wetting layer. The second metal layer 124a may be formed by stacking a second main metal layer and a barrier metal layer.

The ohmic layer, the wetting layer and the barrier metal layer may be additionally deposited for the purpose of the resistance characteristic, the adhesive characteristic and the anti-diffusion characteristic. The ohmic layer, the wetting layer and the barrier metal layer may include, for example, titanium, titanium nitride, tantalum or tantalum nitride.

The first and second metal layers 122a and 124a may include the first main metal layer and the second main metal layer. The second main metal layer may include a metallic material having the etch selectivity with respect to the first main metal layer. The first main metal layer may include a metallic material having the superior step coverage. The second main metal layer may include a metallic material having resistance lower than that of the first main metal layer and superior contact and wiring characteristics. For instance, the first main metal layer may include tungsten and the second main metal layer may include aluminum.

A pad pattern 128 may be connected to the through silicon via contact 126 and may extend to an upper portion of the insulating pattern formed at the backside of the semiconductor layer 100a, 100b. The pad pattern 128 may be positioned in the pad region. The pad pattern 128 may include a conductive material and a stack structure the same as those of the through silicon via contact 126. That is, the pad pattern 128 may have a stack structure of the first and second metal layers 122a and 124a.

A light blocking pattern 123 may be provided on the insulating pattern 120 formed at the backside of the semiconductor layer 100a, 100b. The light blocking pattern 123 may be disposed in opposition to the second photodiode 106b to block light incident into the second photodiode 106b. The light blocking pattern 123, a lower portion of metallic materials included in the through silicon via contact 126 and the pad pattern 128 may include an identical metallic material. The light blocking pattern 123 may include the first metal layer 122a. The light blocking pattern 123 may be thinner than the pad pattern 128.

A protective layer pattern 130a may be provided to cover the through silicon via contact 126, the insulating pattern 120 and the light blocking pattern 123. The protective layer pattern 130a may cover the pad pattern 128 while partially exposing the pad pattern 128. The protective layer pattern 130a may include an insulating material, such as silicon nitride.

A plurality of color filters 132 may be provided on the protective layer pattern 130a in opposition to each unit pixel of the pixel region. Micro lenses 134 may be provided on the color filters 132, respectively. The micro lenses 134 may guide the incident light such that the incident light can be effectively incident into photodiodes of the unit pixel.

FIGS. 4A to 4J are sectional views illustrating a method of manufacturing the backside illumination image sensor illustrated in FIG. 3. FIGS. 5A to 5C are plan views illustrating the method of manufacturing the backside illumination image sensor illustrated in FIG. 3.

Figure 4A:
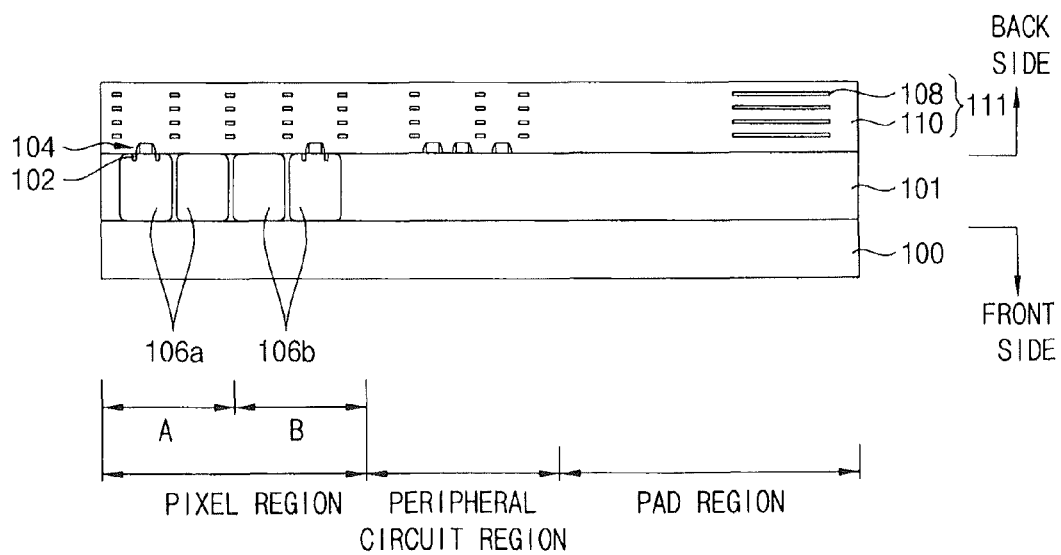
FIGS. 4A to 4J are sectional views illustrating a method of manufacturing the backside illumination image sensor illustrated in FIG. 3.
Figure 5A:
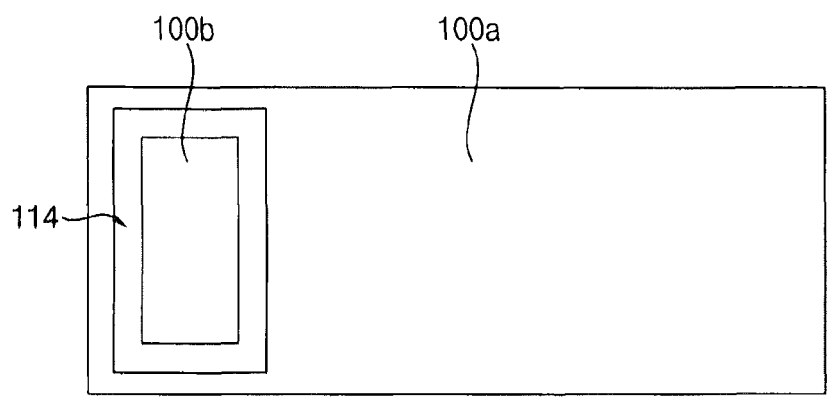
FIGS. 5A to 5C are plan views illustrating a method of manufacturing the backside illumination image sensor illustrated in FIG. 3.
Figure 5B:
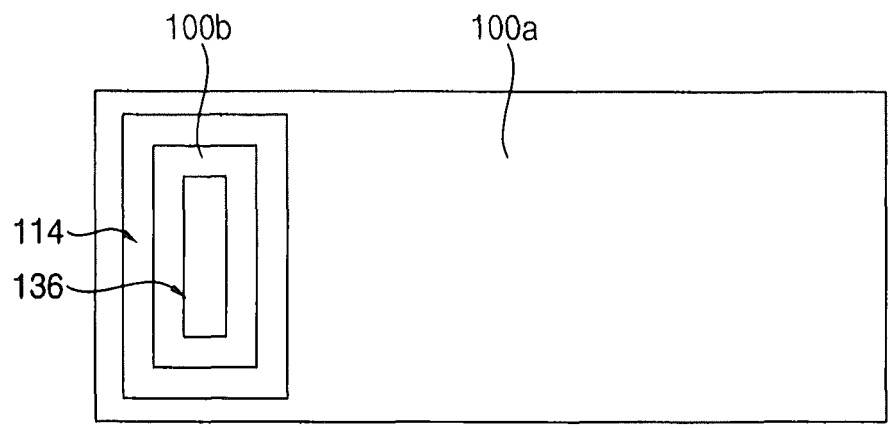
Figure 5C:
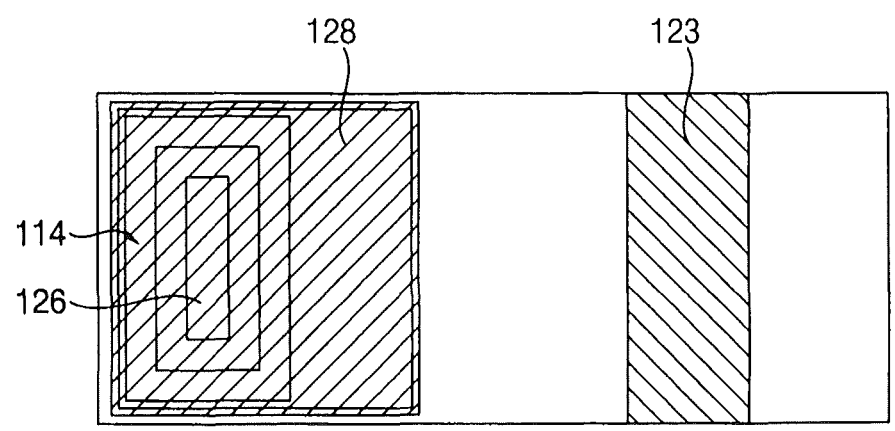

Referring to FIG. 4A, a preliminary semiconductor layer 101 may be formed on the single-crystalline semiconductor substrate 100 through the epitaxial growth process. The preliminary semiconductor layer 101 may include single crystalline silicon. The preliminary semiconductor layer 1001 may be doped with P type impurities having concentration lower than that of the semiconductor substrate 100. The preliminary semiconductor layer 101 may have a thickness of a few μm to several tens of μm.

The pixel region, the peripheral circuit region and the pad region may be formed on the preliminary semiconductor layer 101. In the preliminary semiconductor layer 101, a surface making contact with the semiconductor substrate 100 may serve as a backside and an opposite surface may serve as a front side. In some embodiments, the process for forming the preliminary semiconductor layer may be omitted.

Isolation layer patterns may be formed on the front side of the preliminary semiconductor layer 101 to form the active region and the isolation region on the preliminary semiconductor layer 101. For instance, trenches may be formed in the preliminary semiconductor layer 101 through the STI (shallow trench isolation) process and then the insulating material may be filled in the trenches to form isolation patterns 102. The isolation patterns 102 may electrically insulate the transistors from each other.

After forming an insulating layer and a gate conductive layer on the preliminary semiconductor layer 101, the insulating layer and the gate conductive layer may be patterned to form a gate electrode. Transistors 104 may be formed by forming impurity regions at both sides of the gate electrode. A transfer transistor, a reset transistor, a switch transistor and a select transistor constituting each unit pixel may be provided in the pixel region. In addition, transistors constituting peripheral circuits may be formed in the peripheral circuit region.

The photodiodes 106a and 106b may be formed by implanting impurities into the preliminary semiconductor layer 101 corresponding to the pixel region. The first photodiodes 106a may be formed in the preliminary semiconductor layer 101 of the active pixel region A and the photodiodes 106b may be formed in the preliminary semiconductor layer 101 of the optical black region B.

The transistors may be formed after the photodiodes 106a and 106b are formed, but the formation sequence of the transistors and the photodiodes 106a and 106b may be appropriately changed without limitation.

The insulating interlayer 110 covering the transistors 104 may be formed. The internal wirings 108 including a contact and a conductive line formed through the insulating interlayer 110 may be formed. The internal wirings 108 may include metallic material. Examples of the metallic material may include copper (Cu), platinum (Pt), tungsten (W), aluminum (Al), an alloy layer including the above elements, etc. In addition, the internal wirings 108 may further include a barrier metal layer for suppressing diffusion of the metallic materials. Then, the process for forming the insulating interlayer 110 and the internal wirings 108 may be repeatedly performed to form the insulating interlayer structure 111 including the insulating interlayer 110 and the internal wirings 108 prepared as a multi-layer structure.

The number of layers and the structure of the conductive line and the contact included in the insulating interlayer structure 111 may not be limited, but the number of layers and the structure of the conductive line and the contact may be variously modified according to the device design. Although the conductive line and the contact are illustrated as they do not face the photodiodes 106a and 106b, since the conductive line and the contact may not exert influence upon light transmission, the conductive line and the contact may be aligned regardless of the position of the photodiodes 106a and 106b.

The internal wirings 108 to be connected to the pad pattern formed through the subsequent process may be formed on the pad region.

Figure 4B:
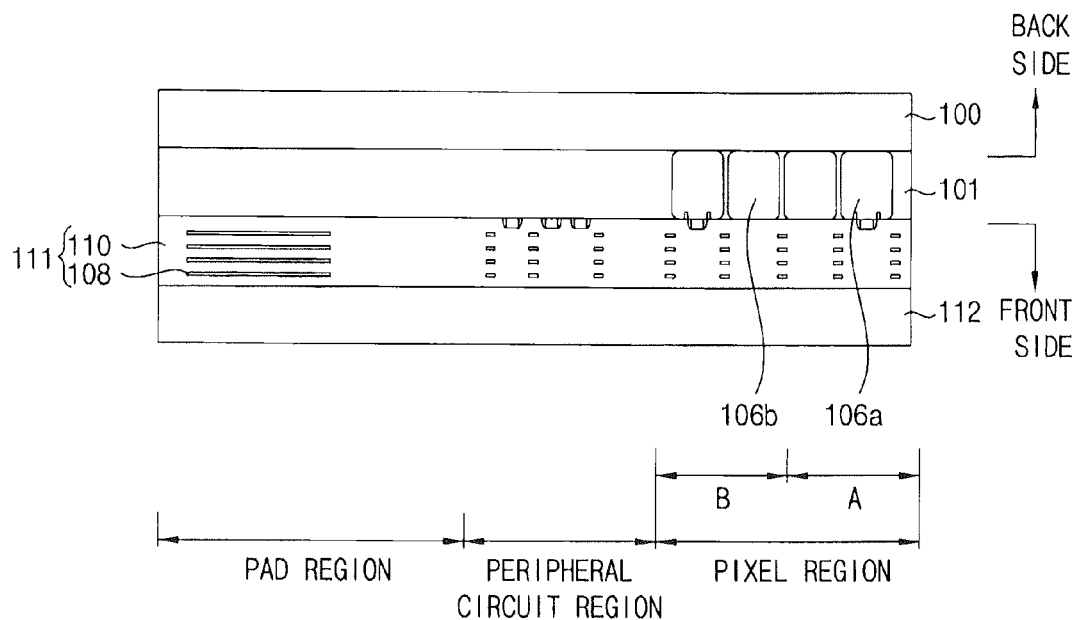

Referring to FIG. 4B, the support substrate 112 may be bonded to the surface of the insulating interlayer structure 111. The support substrate 112 may support the preliminary semiconductor layer 101 and the insulating interlayer structure 111 in the subsequent processes.

Figure 4C:
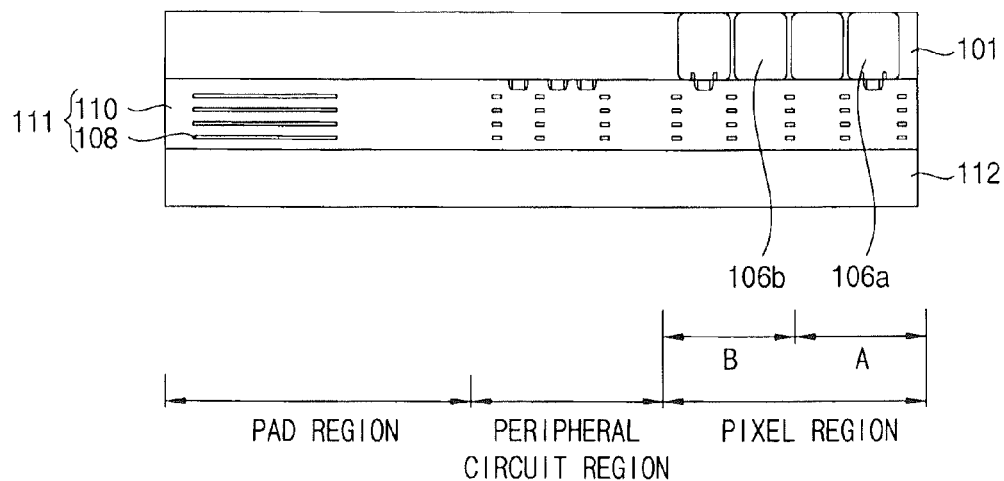

Referring to FIG. 4C, a portion of the semiconductor substrate 100 may be removed by grinding. The preliminary semiconductor layer 101 may be exposed through the grinding process. The surfaces of the first and second photodiodes 106a and 106b may be exposed to the surface of the preliminary semiconductor layer 101.

A portion of the semiconductor substrate 100 may remain after the grinding process. The preliminary semiconductor layer 101 may be partially removed by a predetermined thickness through the grinding process.

Figure 4D:
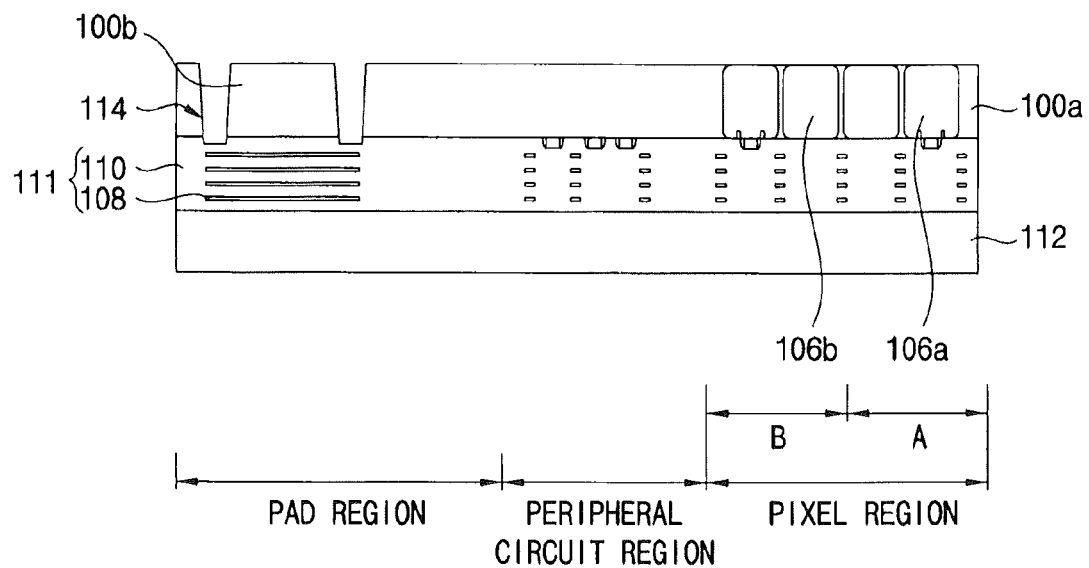

Referring to FIG. 4D, a first etching mask pattern to form the isolation trench 114 may be formed on the preliminary semiconductor layer 101. After etching the preliminary semiconductor layer 101 using the first etching mask pattern as an etching mask, the insulating interlayer structure 111 may be partially etched to form the isolation trench 114. By the etching process, a semiconductor layer 100a, 100b including an outer semiconductor pattern 100a and an inner semiconductor pattern 100b may be formed. The inner semiconductor pattern 100b may be isolated by the isolation trench 114 from the outer semiconductor pattern 100a.

The isolation trench 114 may be formed in the pad region. The isolation trench 114 may be provided to electrically separate and isolate the through silicon via contact and the outer semiconductor pattern 100a, which are formed in the subsequent process, from each other. Thus, as shown in FIG. 5A, when viewed from the top, the isolation trench 114 may have an annular shape surrounding a region where the through silicon via contact is formed.

The insulating interlayer 110 in the insulating interlayer structure 111 may be exposed in the bottom of the isolation trench 114. The internal wirings 108 in the insulating interlayer structure 111 may not be exposed to the inner wall and the bottom surface of the isolation trench 114. The isolation trench 114 may be formed through an over etch process such that the insulating interlayer structure 111 may be exposed by the bottom of the isolation trench 114. Therefore, the bottom surface of the isolation trench 114 may be lower than the front side of the semiconductor layer 100a, 100b.

Figure 4E:
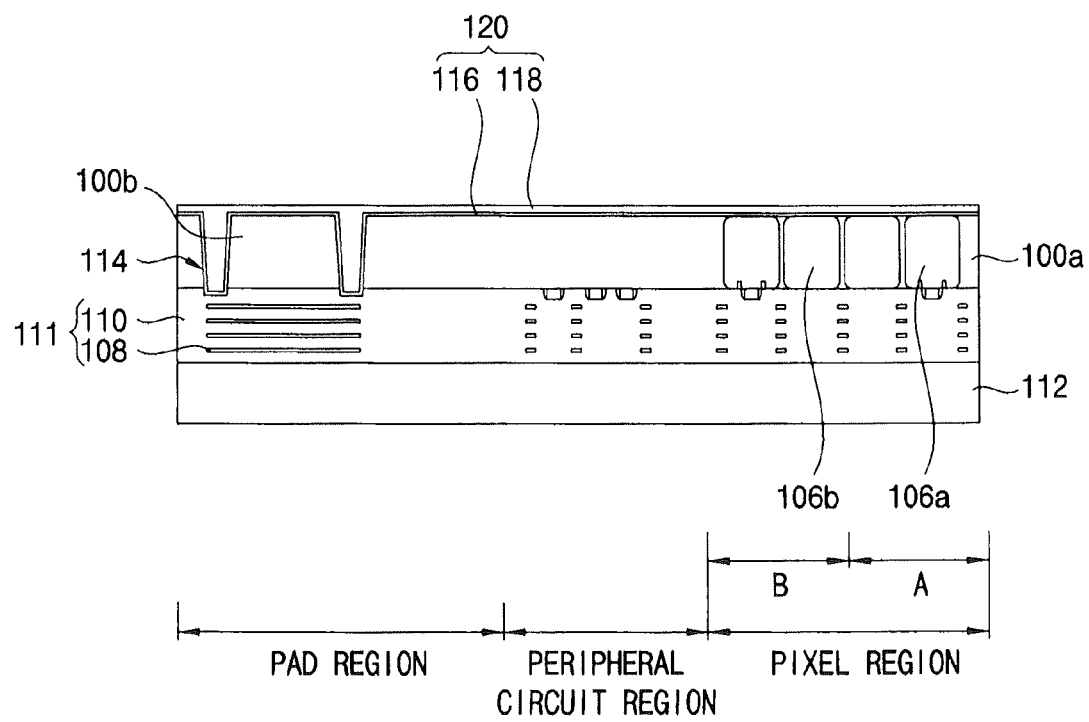

Referring to FIG. 4E, the insulating pattern 120 may fully fill the isolation trench 114 while covering the front side of the semiconductor layer 100a, 100b. The insulating pattern 120 may include the anti-reflective layer 116 and the insulating layer 118. For instance, the anti-reflective layer 116 may be formed conformally on the inner surface of the isolation trench 114 and the front side of the backside of the semiconductor layer 100a, 100b. The insulating layer 118 may be formed on the anti-reflective layer 116 such that the isolation trench 114 may be completely filled with the insulating layer 118.

The anti-reflective layer 116 may be formed by using metal oxide having high light transmittance. For instance, the anti-reflective layer 116 may include hafnium oxide. The insulating layer 118 may include, for example, silicon oxide or silicon nitride. The insulating layer 118 may be formed to have one layer or at least two stacked layer.

The insulating layer 118 may not be formed on the anti-reflective layer 116 and only the anti-reflective layer 116 may fill the isolation trench 114.

Figure 4F:
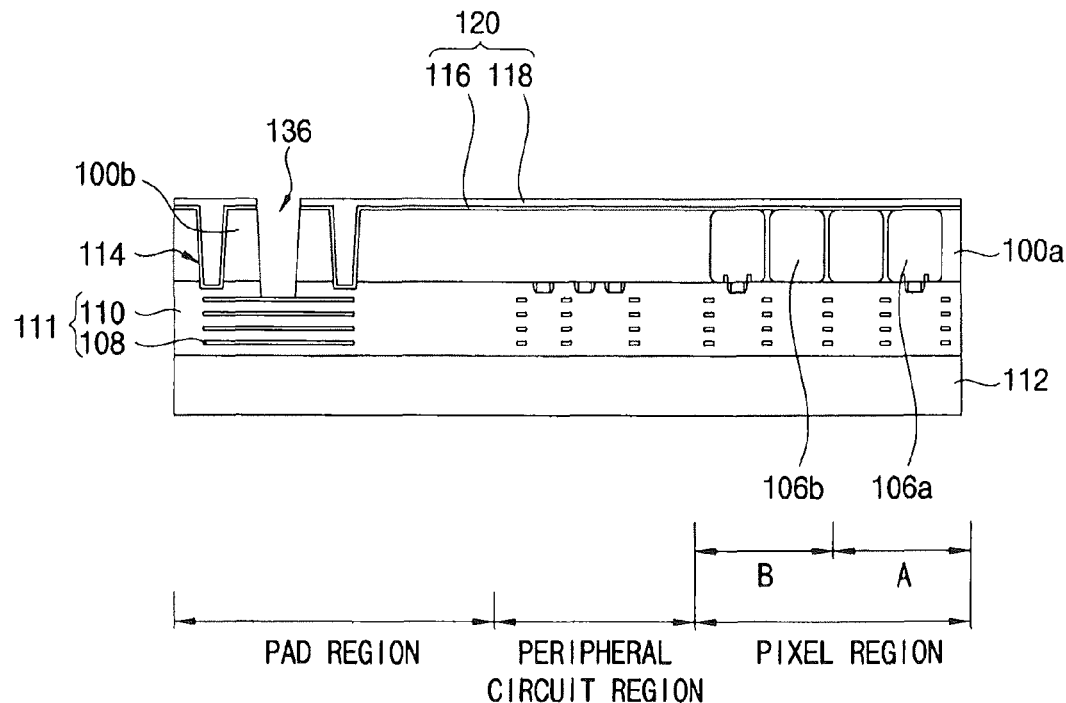

Referring to FIG. 4F, a second etching mask to form the via hole may be formed on the insulating pattern 120. The insulating pattern 120, the inner semiconductor pattern 100b and the insulating interlayer structure 111 may be sequentially and partially etched by using the second etching mask pattern to form the via hole 136 for exposing the internal wiring 108 formed in the pad region.

As can be seen from the plan view of FIG. 5B, the via hole 136 may be formed through the inner semiconductor pattern 100b surrounded by the isolation trench 114 while being spaced apart from the isolation trench 114.

Figure 4G:
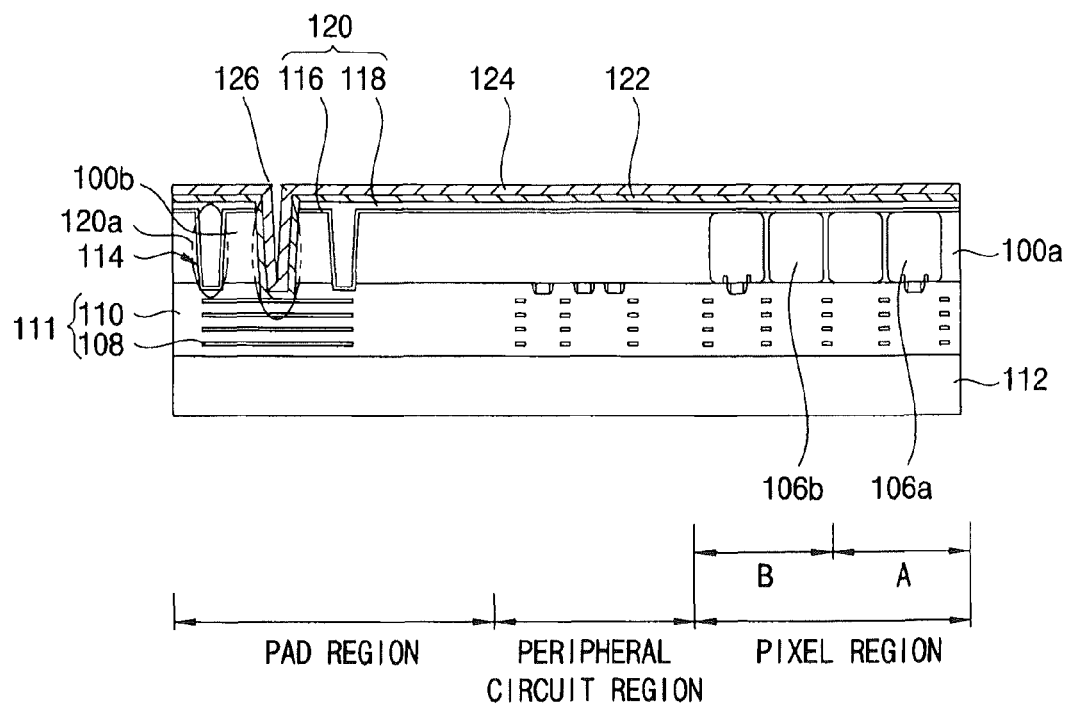

Referring to FIG. 4G, the first and second metal layers 122 and 124 may be formed on the insulating pattern 120 and in the via hole 136. Where the internal width of the via hole 136 is narrow, similar to FIG. 1, the first and second metal layers 122 and 124 may completely fill up the via hole 136. Where the internal width of the via hole 136 is wide the first and second metal layers 122 and 124 may be conformally formed on the sidewall and the bottom surface of the via hole 136 so the via hole 136 may not be fully filled with the first and second metal layers 122 and 124.

For instance, the first metal layer 122 may include a stack structure including an ohmic layer, a first main metal layer and a wetting layer. The first metal layer may serve as a light blocking pattern of the optical black pixel. The first main metal layer of the first metal layer may include a metallic material having superior light reflectivity. The first main metal layer may include a metallic material having the superior step coverage characteristic. For example, the first main metal layer may include tungsten. In addition, materials comprising the ohmic layer and the wetting layer may include titanium, titanium nitride, tantalum, tantalum nitride, etc. The above materials may be used alone or in combination thereof. For instance, the first metal layer 122 may have a stack structure of titanium/titanium nitride/tungsten/titanium nitride layers.

The second metal layer 124 may have a stack structure of the second main metal layer and the barrier metal layer. The second metal layer 124 may be prepared as a via contact and a pad pattern. Thus, the second main metal layer included in the second metal layer 124 may include a material having resistance lower than that of the first main metal layer. In addition, the second main metal layer may have the etch selectivity with respect to the first main metal layer. For instance, the second main metal layer may include aluminum. In addition, the second metal layer 124 may include a stack structure including aluminum/titanium nitride layers.

As the first and second metal layers 122 and 124 have been formed, the through silicon via contact 126 connected to the internal wiring 108 of the insulating interlayer structure 111 may be formed in the via hole 136. The insulating spacer may not be provided at the sidewall of the through silicon via contact 126. The sidewall of the through silicon via contact 126 may directly contact the inner semiconductor pattern 100b.

Figure 4H:
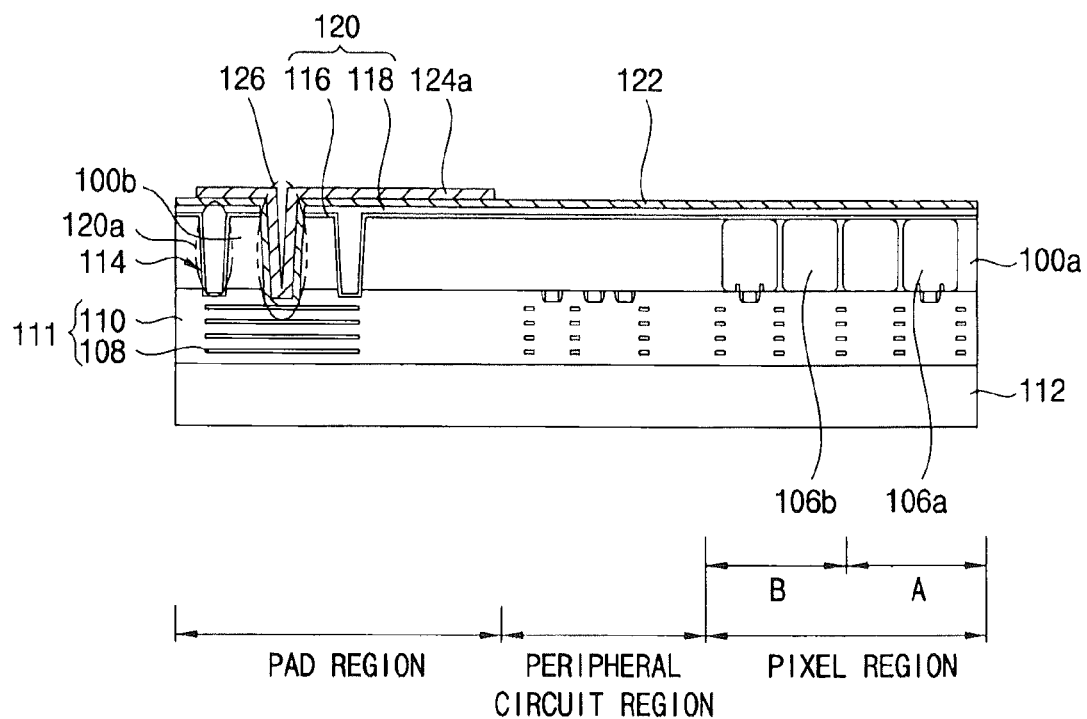

Referring to FIG. 4H, a third mask pattern may be formed on the second metal layer 124. The second metal layer 124 may be etched by using the third mask pattern as an etching mask to form a preliminary pad pattern 124a on the pad region. During the etching process, the first metal layer 122 may remain without being etched. Thus, the surface of the first metal layer 122 may be exposed at the region where the preliminary pad pattern 124a is not formed.

Figure 4I:
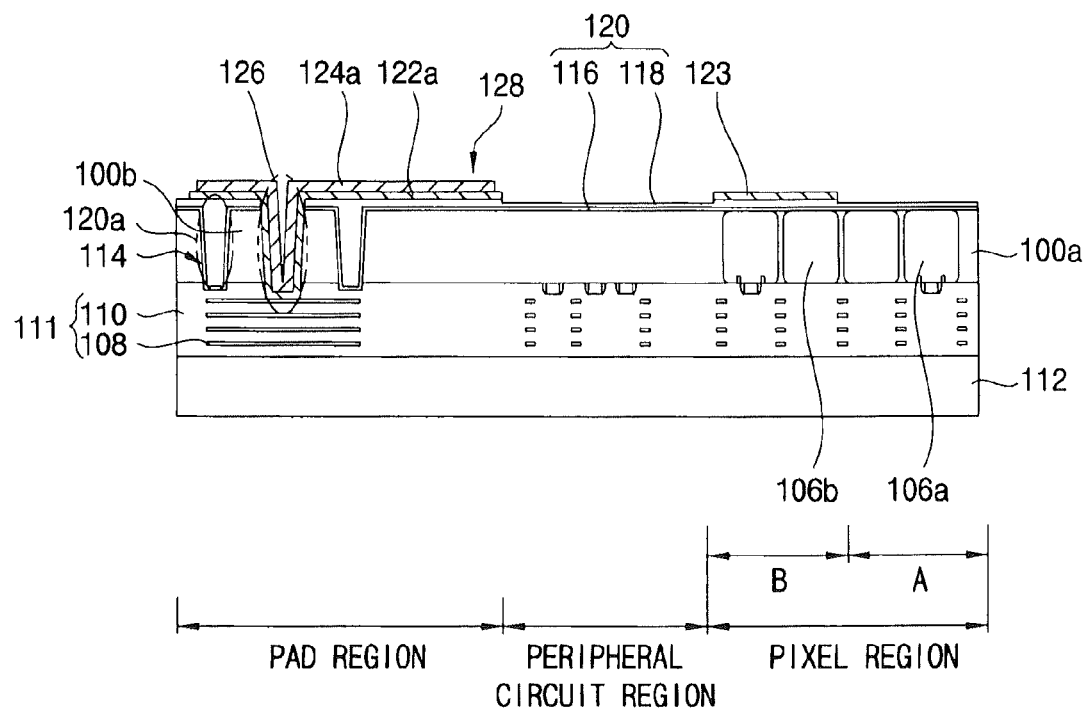

Referring to FIG. 4I, a fourth mask pattern may be formed on the first metal layer 122 and the preliminary pad pattern 124a. The fourth mask pattern may cover the top surface of the preliminary pad pattern 124a and the first metal layer 122 formed on the optical black region B. The light blocking pattern 123 and the pad pattern 128 may be formed, respectively, by etching the first metal layer 122 using the fourth mask pattern.

The light blocking pattern 123 is aligned on the insulating pattern 120 and may exclusively include the first metal layer 122. In addition, the pad pattern 128 may have a stack structure of first and second metal layers 122a and 124a. Thus, light blocking pattern 123 may be thinner than the pad pattern 128.

In the process of etching the first metal layer 122, the insulating layer 118 formed under the first metal layer 122a may be partially or completely etched. However, the anti-reflective layer 116 formed under the insulting layer 118 may remain without being etched.

The through silicon via contact 126 may have a stacked structure of the first and second metal layers 122a and 124a, and an additional insulating spacer is not provided at the sidewall of the via hole 136. The through silicon via contact 126 may be electrically insulated from the outer semiconductor pattern 100a by the isolation trench 114 and the insulating pattern 120.

Figure 4J:
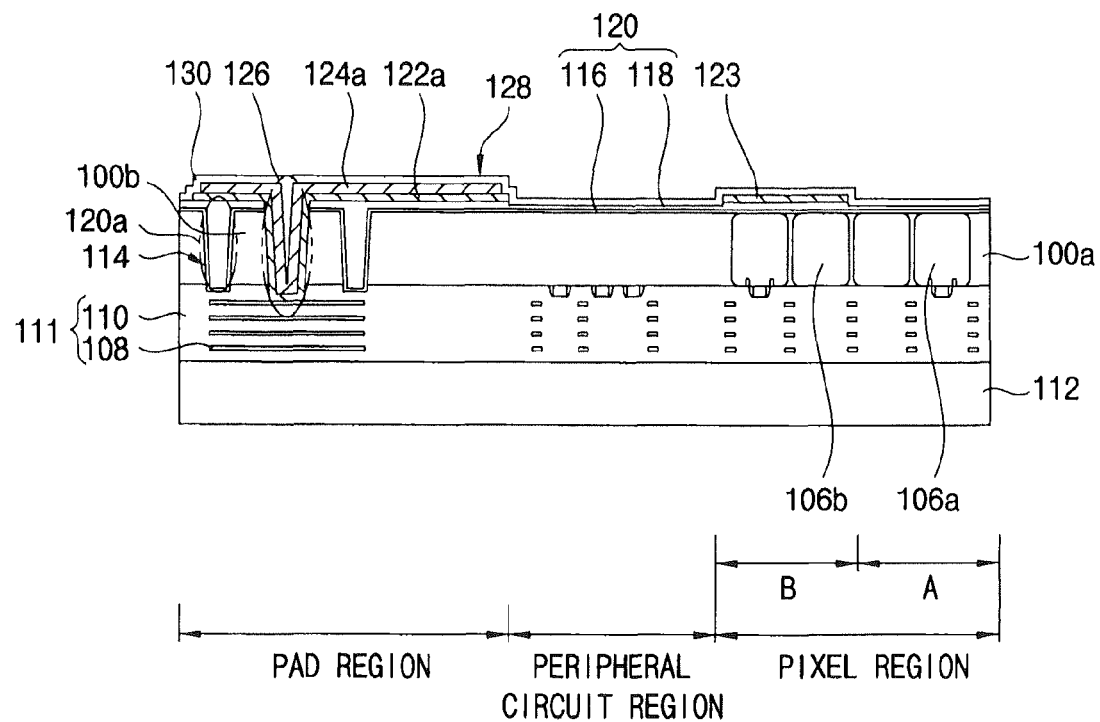

Referring to FIGS. 4J and 5C, the protective layer 130 may be formed to cover the through silicon via contact 126, the pad pattern 128, the insulating pattern 120 and the light blocking pattern 123. When the protective layer 130 is formed, an opening part in the through silicon via contact 126 may be completed filled with the protective layer 130. The protective layer 130 may have a thickness in range of 500 Å to 2000 Å.

The protective layer 130 thinner than 500 Å may not sufficiently protect lower structures. In addition, it may be undesirable to provide the protective layer 130 thicker than 2000 Å. The protective layer 130 may include, for example, silicon nitride.

Referring again to FIG. 3, the color filters 132 may be provided on the protective layer 130 in opposition to each unit pixel of the pixel region. The micro lenses 134 may be provided on the color filters 132, respectively.

The protective layer 130 formed on the pad pattern 128 may be removed such that the top surface of the pad pattern 128 may be at least partially exposed, thereby forming the protective layer pattern 130a. The pad pattern 128 may serve as an electrode to receive external signals.

Figure 6:
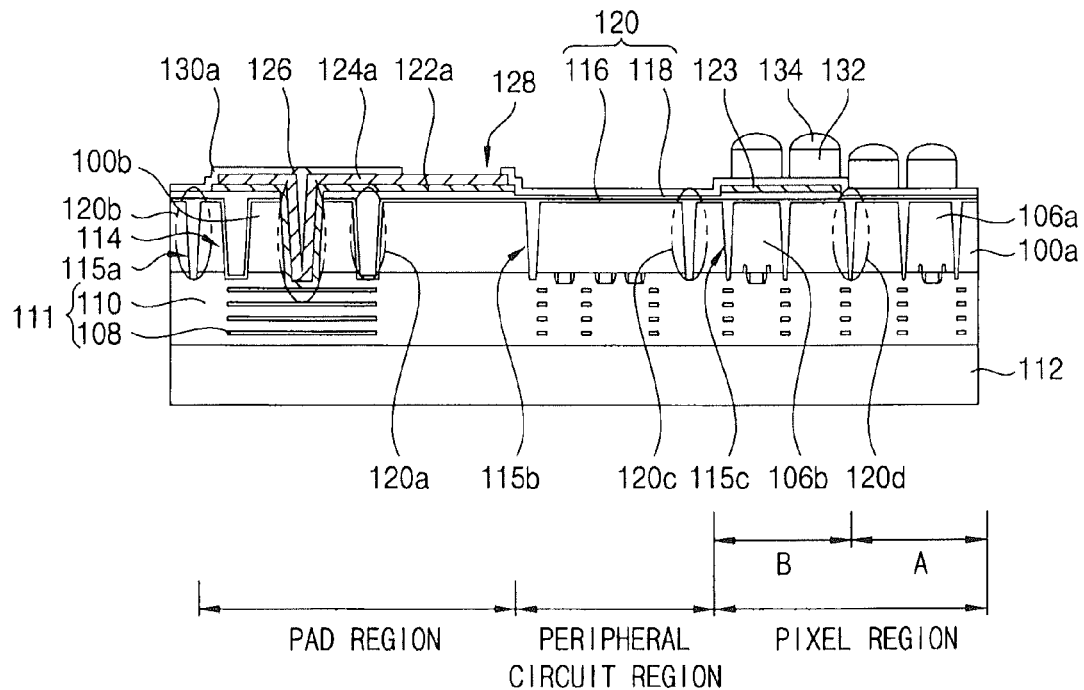
FIG. 6 is a sectional view illustrating a backside illumination image sensor in accordance with some embodiments.

FIG. 6 is a sectional view illustrating a backside illumination image sensor in accordance with some embodiments.

Referring to FIG. 6, the semiconductor layer 100a, 100b may be provided to manufacture the backside illumination image sensor. The semiconductor layer 100a, 100b may include the pixel region, the peripheral circuit region and the pad region.

The transistors may be provided on the front side of the semiconductor layer 100a, 100b. The transistors included in each unit pixel may be provided in the pixel region and the transistors constituting the peripheral circuits may be provided in the peripheral circuit region. Further, the insulating interlayer and the internal wirings may be formed on the front side of the semiconductor layer 100a, 100b.

The photodiodes 106a and 106b may be provided in the pixel region of the semiconductor layer 100a, 100b. First photodiodes 106a may be provided in the active pixel region A and second photodiodes 106b may be provided in the optical black region B.

A via isolation trench 114 may be formed through the semiconductor layer 100a, 100b from the backside of the pad region of the semiconductor layer 100a, 100b to expose the insulating interlayer 110 of the insulating interlayer structure 111. The via isolation trench 114 may be identical to the isolation trench shown in FIG. 3. That, the semiconductor layer 100a, 100b may include an outer semiconductor pattern 100a and inner semiconductor pattern 100b isolated from the outer semiconductor 100a by the via isolation trench 114.

A circuit block isolation trench 115b may be formed through the semiconductor layer 100a, 100b from the backside of the peripheral circuit region of the semiconductor layer 100a, 100b to expose the insulating interlayer 110 of the insulating interlayer structure 111. The semiconductor layer 100a, 100b may be divided by the circuit block isolation trench 115b such that each peripheral circuit may be divided in a block unit. Thus, interference and noise between the peripheral circuits may be suppressed.

In addition, a pixel isolation trench 115c may be formed through the semiconductor layer 100a, 100b from the backside of the pixel region of the semiconductor layer 100a, 100b to expose the insulating interlayer 110 of the insulating interlayer structure 111. The pixel isolation trench 115c may be formed through the semiconductor layer 100a, 100b between the first photodiodes 106a and the semiconductor layer 100a, 100b between the second photodiodes 106b. The pixel isolation trench 115c may be configured to partition the first and second photodiodes 106a and 106b included in each unit pixel. Due to the pixel isolation trench 115c, an optical crosstalk between the pixels may be reduced.

A crack prevention trench 115a may be formed in the pad region at an outside of the via isolation trench 114 corresponding to an edge portion of the image sensor. The crack prevention trench 115a may be formed through the semiconductor layer 100a, 100b from the backside of the semiconductor layer 100a, 100b to expose the insulating interlayer 110 of the insulating interlayer structure 111. The crack prevention trench 115a may reduce the crack occurring in the sawing process to form the package.

The insulating pattern 120 may be provided to cover the entire surface of the backside of the semiconductor layer 100a, 100b and to fill up the via isolation trench 114, the circuit block isolation trench 115b, the pixel isolation trench 115c and the crack prevention trench 115a. The insulating pattern 120 may have a stack structure of the anti-reflective layer 116 and the insulating layer 118. The anti-reflective layer 116 may include an insulating material having high transmittance. The anti-reflective layer 116 may include metal oxide, such as hafnium oxide. The insulating layer 118 may include silicon oxide or silicon nitride. The insulating layer 118 may be an optional element and may be omitted.

The circuit block isolation trench 115b, the pixel isolation trench 115c and the crack prevention trench 115a may have a width narrower than the via isolation trench 114. Thus, only the anti-reflective layer 116 may be filled in the circuit block isolation trench 115b, the pixel isolation trench 115c and the crack prevention trench 115a. In contrast, the via isolation trench 114 having the relatively wide width may be filled with the anti-reflective layer 116 and the insulating layer 118.

The insulating pattern filled in the via isolation trench 114 may serve as an isolation pattern 120a that electrically insulates the through silicon via contact from a silicon layer. In addition, the insulating pattern 120 filled in the circuit block isolation trench 115b, the pixel isolation trench 115c and the crack prevention trench 115a may serve as a pixel isolation pattern 120d, a circuit block isolation pattern 120c and a crack prevention pattern 120b.

The through silicon via contact 126 is spaced apart from the via isolation trench 114 and formed through the inner semiconductor pattern 100b, which is formed inside the annular-shape isolation trench, to make contact with the internal wiring 108 formed below the through silicon via contact 126. The pad pattern 128 may be connected to the through silicon via contact 126 and may extend to the upper portion of the insulating pattern 120 formed at the backside of the semiconductor layer 100a, 100b.

The light blocking pattern 123 may be provided on the insulating pattern 120 formed at the backside of the semiconductor layer 100a, 100b. The light blocking pattern 123 is disposed in opposition to the second photodiode to block light incident into the second photodiode. In addition, the protective layer pattern 130a may be provided to cover the through silicon via contact 126, the insulating pattern 120 and the light blocking pattern 123. A plurality of color filters 132 and micro lenses 134 may be provided on the protective layer pattern 130a in opposition to each unit pixel of the pixel region.

The through silicon via contact 126, the pad pattern 128, the light blocking pattern 123, the protective layer pattern 130a, the color filters 132 and the micro lenses 134 may have the structures the same as the structures illustrated in FIG. 3.

In some embodiments, the circuit block isolation trench 115b, the pixel isolation trench 115c and the crack prevention trench 115a may be provided on the semiconductor layer 100a, 100b. In some embodiments, at least one of the circuit block isolation trench 115b, the pixel isolation trench 115c and the crack prevention trench 115a may be provided at the semiconductor layer 100a, 100b.

Figure 7A:
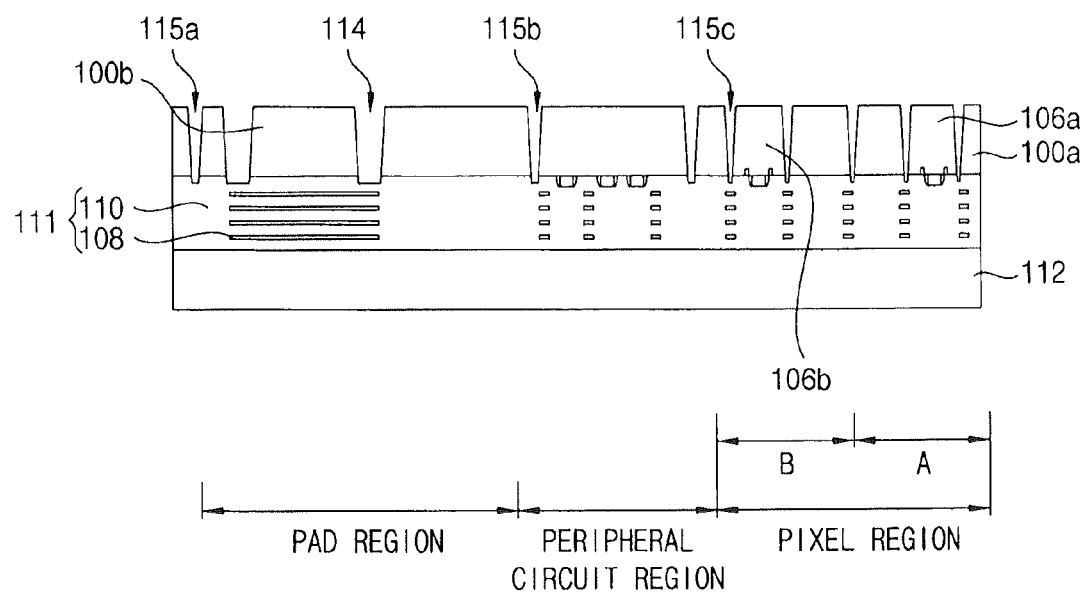
FIGS. 7A and 7B are sectional views illustrating a method of manufacturing the backside illumination image sensor illustrated in FIG. 6.
Figure 7B:
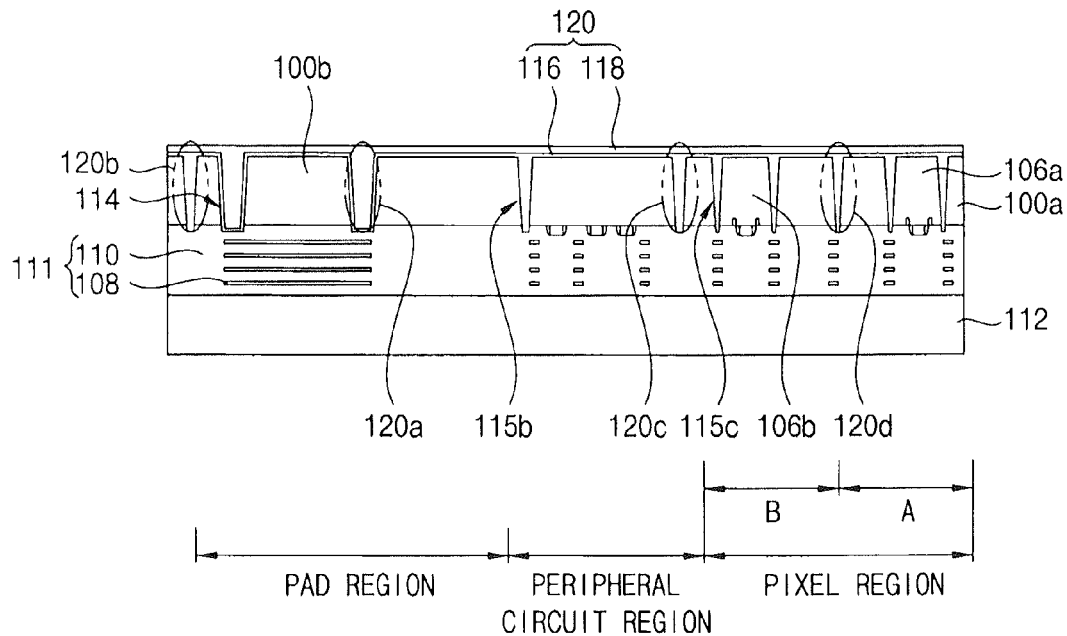

FIGS. 7A and 7B are sectional views illustrating a method of manufacturing the backside illumination image sensor illustrated in FIG. 6.

The structure illustrated in FIG. 4C may be formed by performing the processes described with reference to FIGS. 4A and 4C.

Referring to FIG. 7A, the first etching mask pattern may be formed on the preliminary semiconductor layer. The first etching mask pattern is a mask to form the via isolation trench 114, the circuit block isolation trench 115b, the pixel isolation trench 115c and the crack prevention trench 115a. The via isolation trench 114, the circuit block isolation trench 115b, the pixel isolation trench 115c and the crack prevention trench 115a for exposing the insulating interlayer 110 in the insulating interlayer structure 111 may be formed by etching the preliminary semiconductor layer using the first etching mask pattern. The via isolation trench 114 may have same shape as the isolation trench 114 illustrated in FIG. 4D. A semiconductor layer 100a, 100b including an outer semiconductor pattern 100a and an inner semiconductor pattern 100b is formed by the etching process. The inner semiconductor pattern 100b may be isolated by the via isolation trench 114 from the outer semiconductor pattern 100a.

Since the insulating interlayer 110 in the insulating interlayer structure 111 may be slightly etched during the etching process, the bottom surfaces of the trenches 114 and 115a to 115c may be aligned lower than the front side of the semiconductor layer 100a, 100b.

In addition, since the via isolation trench 114, the circuit block isolation trench 115b, the pixel isolation trench 115c and the crack prevention trench 115a may be simultaneously formed through one photolithography process, an additional process for forming the circuit block isolation trench 115b, the pixel isolation trench 115c and the crack prevention trench 115a may not be necessary.

Referring to FIG. 7B, the insulating pattern 120 is formed to cover the entire top surface of the backside of the semiconductor layer 100a, 100b such that the via isolation trench 114, the circuit block isolation trench 115b, the pixel isolation trench 115c and the crack prevention trench 115a may be completely filled with the insulating pattern 120. The insulating pattern 120 may include the anti-reflective layer 116 and the insulating interlayer 118.

For example, the anti-reflective layer 116 may be formed along the profile of the inner surfaces of the via isolation trench 114, the circuit block isolation trench 115b, the pixel isolation trench 115c and the crack prevention trench 115a while covering the entire surface of the backside of the semiconductor layer 100a, 100b. The circuit block isolation trench 115b, the pixel isolation trench 115c and the crack prevention trench 115a may have an internal width narrower than an internal width of the via isolation trench 114. Thus, the anti-reflective layer 116 may be completely filled in the circuit block isolation trench 115b, the pixel isolation trench 115c and the crack prevention trench 115a. Then, the insulting layer 118 may be formed on the anti-reflective layer 116. The insulting layer 118 may be formed on the semiconductor layer 100a, 100b such that the via isolation trench 114 may be completely filled with the insulating layer 118. In some embodiments, the insulating layer may not be formed on the anti-reflective layer.

The subsequent processes are similar to the processes described with reference to FIGS. 4F to 4J. The image sensor having the structure illustrated in FIG. 6 may be formed through the above processes.

In the image sensor of the present example embodiment, the circuit bock isolation trench 115b may be formed in the semiconductor layer, so the interference and noise between unit circuits may be reduced. Since the pixel isolation trench 115c may be formed in the semiconductor layer, the optical crosstalk between the pixels may be reduced. In addition, since the crack prevention trench 115a may be formed in the semiconductor layer, crack generated when the sawing process is performed to package the image sensor can be reduced.

Figure 8:
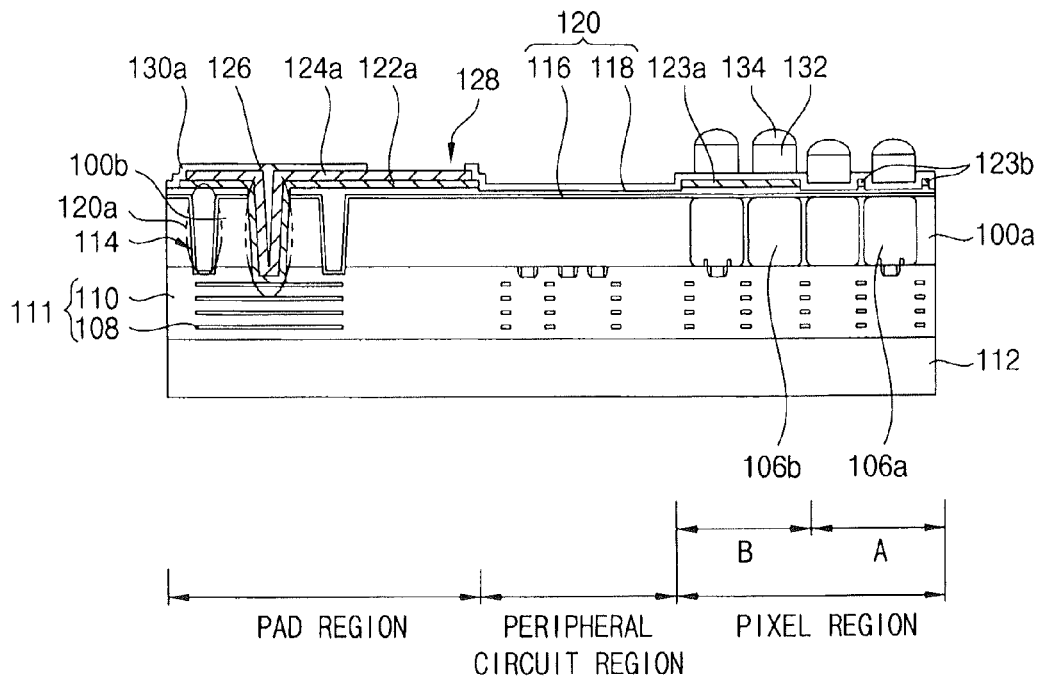
FIG. 8 is a sectional view illustrating a backside illumination image sensor in accordance with some embodiments.

FIG. 8 is a sectional view illustrating a backside illumination image sensor in accordance with some embodiments.

Referring to FIG. 8, the semiconductor layer 100a, 100b may be provided to manufacture the backside illumination image sensor. The semiconductor layer 100a, 100b may include the pixel region, the peripheral circuit region and the pad region.

The transistors may be provided on the front side of the semiconductor layer 100a, 100b. In addition, the insulating interlayer structure 111 including the insulating interlayer 110 and the internal wirings 108 may be provided on the front side of the semiconductor layer 100a, 100b. The photodiodes 106a and 106b may be provided in the pixel region of the semiconductor layer 100a, 100b. First photodiodes 106a may be provided in the active pixel region A and second photodiodes 106b may be provided in the optical black region B.

The isolation trench 114 may be formed through the semiconductor layer 100a, 100b from the backside of the pad region of the semiconductor layer 100a, 100b to expose the insulating interlayer 110 of the insulating interlayer structure 111. The insulating pattern may be filled in the isolation trench 114 while covering the entire surface of the backside of the semiconductor layer 100a, 100b. The semiconductor layer 100a, 100b may include an outer semiconductor pattern 100a and an inner semiconductor pattern 100b. The inner semiconductor pattern 100b is isolated by the isolation trench 114 from the outer semiconductor pattern 100a.

The through silicon via contact 126 is spaced apart from the isolation trench 114 and formed through the inner semiconductor pattern 100b, which is formed inside the annular-shape isolation trench, to make contact with the internal wiring 108. The pad pattern 128 may be connected to the through silicon via contact 126 and may extend to the upper portion of the insulating pattern 120 formed at the backside of the semiconductor layer 100a, 100b.

A light blocking pattern 123a may be provided on the insulating pattern 120 formed at the backside of the semiconductor layer 100a, 100b. The light blocking pattern 123a may be disposed in opposition to the second photodiode 106b to block light incident into the second photodiode 106b. The light blocking pattern 123a may include a metallic material identical to a metallic material formed at a lower portion of metallic materials included in the through silicon via contact 126 and the pad pattern 128. That is, the light blocking pattern 123a may include the first metal layer 122a. The light blocking pattern 123a may have a thickness thinner than a thickness of the pad pattern 128.

An optical crosstalk prevention pattern 123b may be provided on the insulating pattern 120 formed at the backside of the semiconductor layer 100a, 100b. The optical crosstalk prevention pattern 123b may be formed among the first photodiodes 106a to distinguish the first photodiodes 106a from each other. As illustrated in FIG. 9B, the optical crosstalk prevention pattern 123b may have a lattice shape to partition the first photodiodes 106a from each other. The first photodiodes 106a may be provided within the lattice structure of the optical crosstalk prevention pattern 123b. The optical crosstalk prevention pattern 123b and the light blocking pattern 123a may include an identical material. The optical crosstalk prevention pattern 123b may include the first metal layer 122a. The optical crosstalk prevention pattern 123b may be thinner than the pad pattern 128.

The protective layer pattern 130a may be provided to cover the through silicon via contact 126, the insulating pattern 120, the optical crosstalk prevention pattern 123b and the light blocking pattern 123a. A plurality of color filters 132 and micro lenses 134 may be provided on the protective layer pattern 130a in opposition to each unit pixel of the pixel region.

Figure 9A:
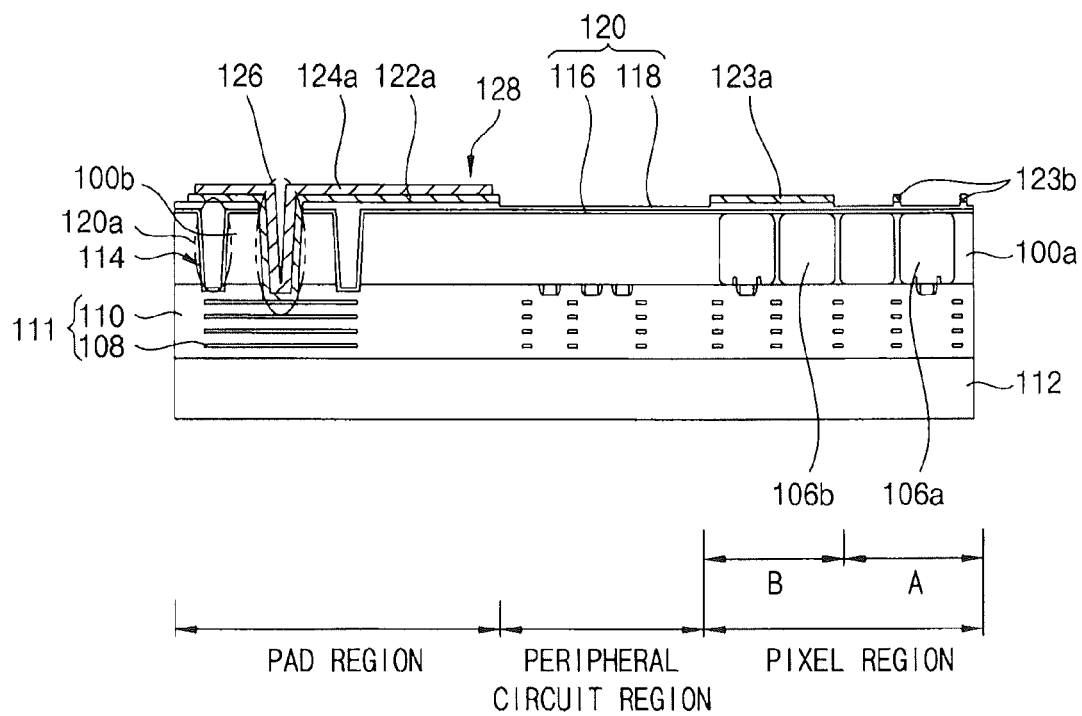
FIGS. 9A and 9B are sectional and plan views illustrating a method of manufacturing the backside illumination image sensor illustrated in FIG. 8, respectively.
Figure 9B:
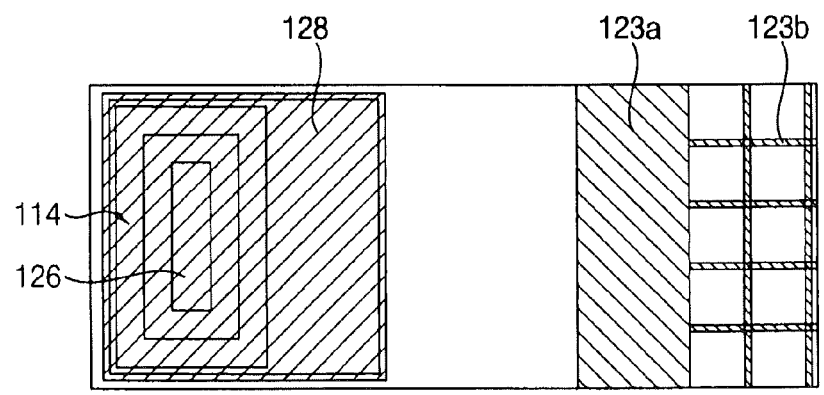

FIG. 9A is a sectional view illustrating a method of manufacturing the backside illumination image sensor illustrated in FIG. 8. FIG. 9B is a plan view illustrating a method of manufacturing the backside illumination image sensor illustrated in FIG. 8.

The structure illustrated in FIG. 4H may be formed by performing the processes described with reference to FIGS. 4A and 4H.

Referring to FIGS. 4H, 9A and 9B, the fourth etching mask may be formed on the first metal layer 122 and the preliminary pad pattern 124a. The fourth etching mask pattern may cover the top surface of the preliminary pad pattern 122a, the optical black region and regions among the first photodiodes. The light blocking pattern 123a, the pad pattern 128 and the optical crosstalk prevention pattern 123b may be formed by etching the first metal layer 122 using the fourth etching mask. The optical crosstalk prevention pattern 123b may have the lattice shape. The optical crosstalk prevention pattern 123b may not face the upper portion of the first photodiodes 106a and the first photodiodes 106a are aligned within the lattice structure of the optical crosstalk prevention pattern 123b.

The light blocking pattern 123a and the optical crosstalk prevention pattern 123b may be formed on the insulating pattern 120 by using only the first metal layer 122a. The pad pattern 128 may have a stack structure of the first and second metal layers 122a and 124a. The light blocking pattern 123a and the optical crosstalk prevention pattern 123b may be thinner the pad pattern 128.

The insulting layer 118 formed below the first metal layer 122a may be partially etched during the etching process for the first metal layer 122a. However, the anti-reflective layer 116 formed under the insulating layer 118 may remain without being etched.

The optical crosstalk prevention pattern 123b may be simultaneously formed in the process of forming the light blocking pattern 123a without performing an additional photolithography process.

Referring again to FIG. 8, a protective layer 130a may be formed to cover the through silicon via contact 126, the pad pattern 128, the insulating pattern 120, the optical crosstalk prevention pattern 123b and the light blocking pattern 123a. The color filters 132 may be formed on the protective layer in opposition to each unit pixel of the pixel region. Then, the micro lenses 134 may be formed on the color filters 132. The protective layer formed on the pad pattern 128 may be removed such that the top surface of the pad pattern 128 may be at least partially exposed, thereby forming the protective layer pattern 130a.

In the image sensor of the present example embodiment, the optical crosstalk prevention pattern 123b may be provided on the insulating pattern to distinguish the first photodiodes from each other. Thus, the optical crosstalk between the pixels can be reduced.

Figure 10:
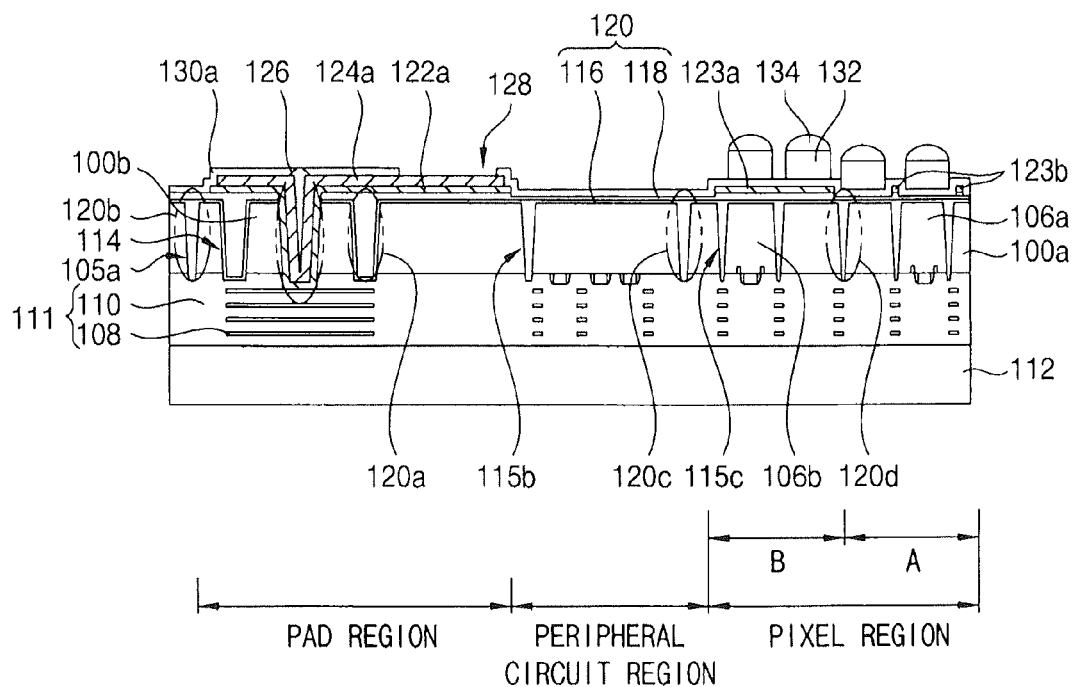
FIG. 10 is a sectional view illustrating a backside illumination image sensor in accordance with some embodiments.

FIG. 10 is a sectional view illustrating a backside illumination image sensor in accordance with some embodiments. Referring to FIG. 10, the backside illumination image sensor may include a circuit block isolation trench 115b, a pixel isolation trench 115c, and a crack prevention trench 115a in the semiconductor layer.

Figure 11:
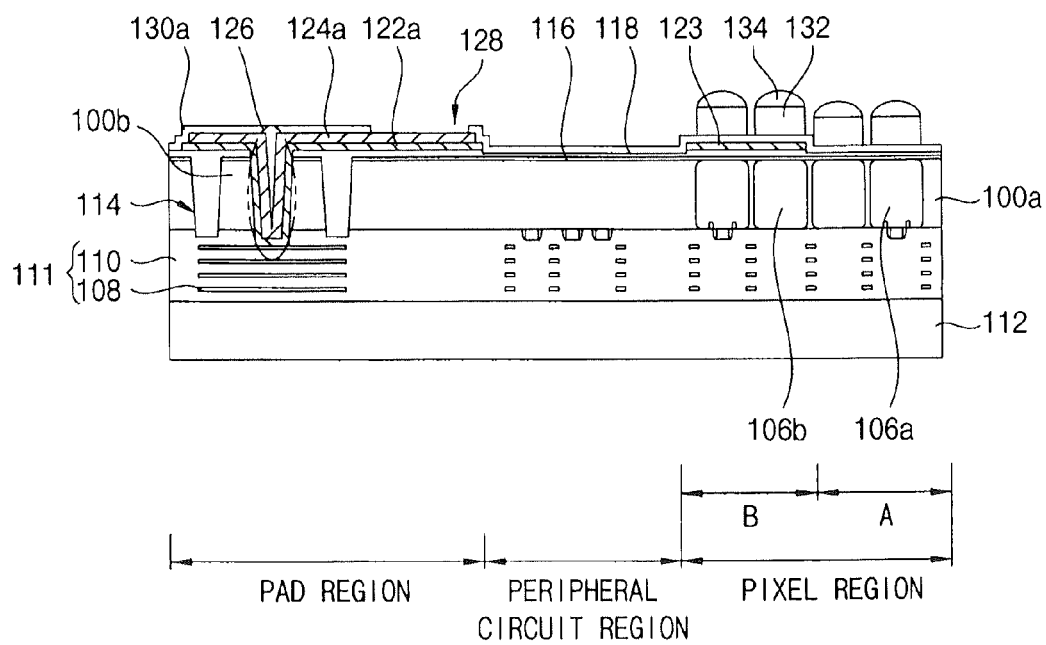
FIG. 11 is a sectional view illustrating a backside illumination image sensor in accordance with some embodiments.

FIG. 11 is a sectional view illustrating a backside illumination image sensor in accordance with some embodiments. Referring to FIG. 11, the semiconductor layer 100a, 100b may be provided to manufacture the backside illumination image sensor. The transistors may be provided on the front side of the semiconductor layer 100a, 100b. In addition, the insulating interlayer 110 and the internal wirings 108 may be provided on the front side of the semiconductor layer 100a, 100b.

The photodiodes 106a and 106b may be provided in the pixel region of the semiconductor layer 100a, 100b. The photodiodes 106a and 106b may be provided in the pixel region of the semiconductor layer 100a, 100b. First photodiodes 106a may be provided in the active pixel region A and second photodiodes 106b may be provided in the optical black region B.

The via isolation trench 114 may be formed through the semiconductor layer 100a, 100b from the backside of the pad region of the semiconductor layer 100a, 100b to expose the insulating interlayer 110 of the insulating interlayer structure 111. The semiconductor layer 100a, 100b may include an outer semiconductor pattern 100a and an inner semiconductor pattern 100b. The inner semiconductor pattern 100b is isolated by the via isolation trench 114 from the outer semiconductor pattern 100a.

The anti-reflective layer 116 may be provided on a flat surface formed on an upper portion of the backside of the semiconductor layer 100a, 100b. That is, the anti-reflective layer 116 may not be provided in the via isolation trench 114. The anti-reflective layer 116 may include an insulating material having high transmittance. The anti-reflective layer 116 may include metal oxide, such as hafnium oxide.

In addition, the insulating layer 118 may be formed on the anti-reflective layer 116 while filling up the via isolation trench 114. The insulating layer 118 may include silicon oxide or silicon nitride.

In some embodiments, the insulating layer 118 may directly contact with the interior of the via isolation trench 114 and may serve as an isolation layer pattern to electrically isolate the through silicon via contact 126 from the outer semiconductor pattern 100a.

The through silicon via contact 126 is spaced apart from the via isolation trench 114 and formed through the inner semiconductor pattern 100b, which is formed inside the annular-shape isolation trench, to make contact with the internal wiring 108. The pad pattern 128 may be connected to the through silicon via contact 126 and extends to the upper portion of the insulating pattern 120 formed at the backside of the semiconductor layer 100a, 100b.

The light blocking pattern 123 may be provided on the insulating pattern 120 formed at the backside of the semiconductor layer 100a, 100b. The light blocking pattern 123 may be disposed in opposition to the second photodiode 106b to block light incident into the second photodiode 106b. The protective layer pattern 130a may be provided to cover the through silicon via contact 126, the insulating pattern 120, and the light blocking pattern 123a. A plurality of color filters 132 and micro lenses 134 may be provided on the protective layer pattern 130a in opposition to each unit pixel of the pixel region.

Figure 12A:
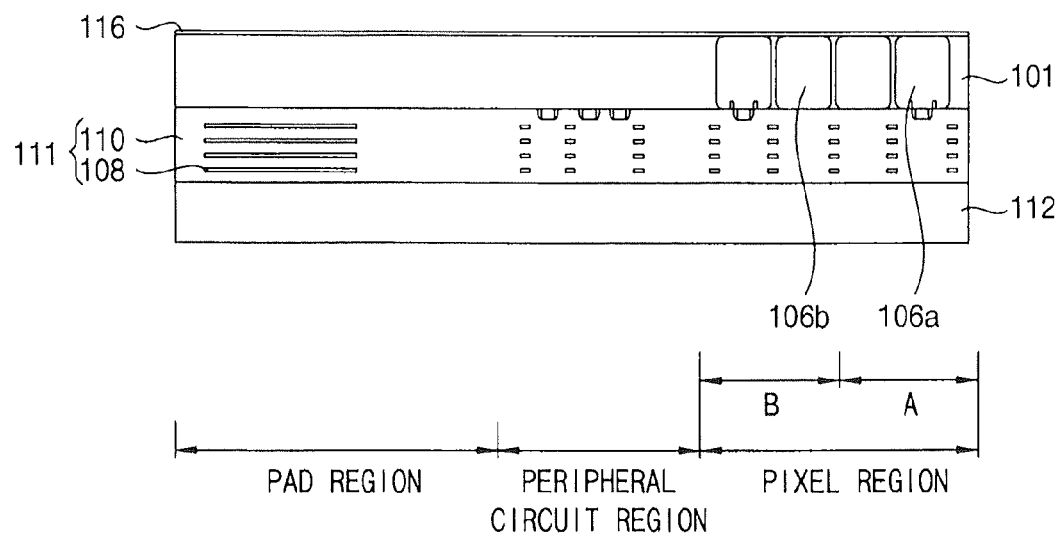
FIGS. 12A to 12C are sectional views illustrating a method of manufacturing the backside illumination image sensor illustrated in FIG. 11.
Figure 12B:
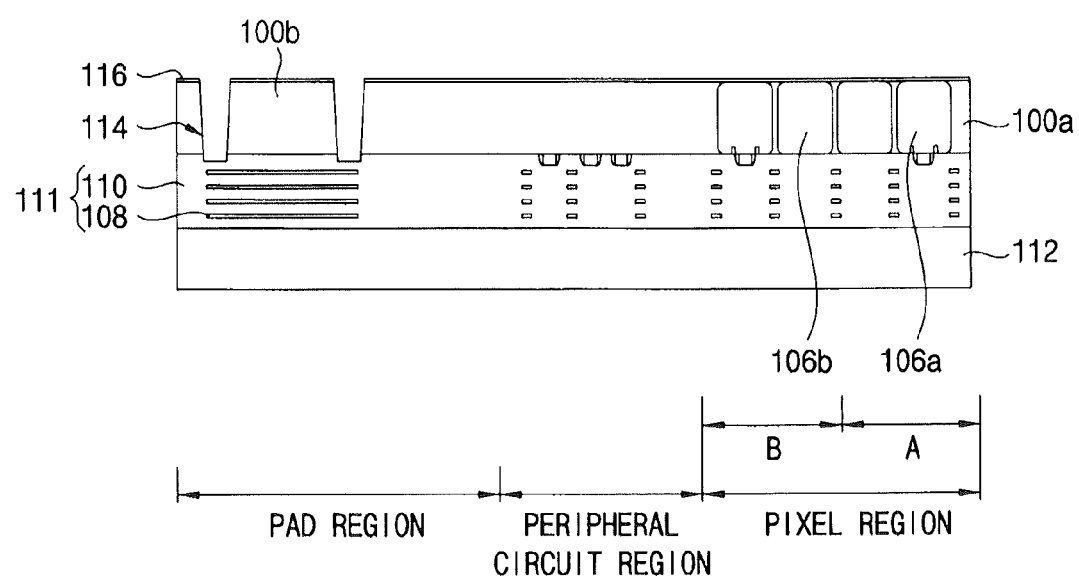
Figure 12C:
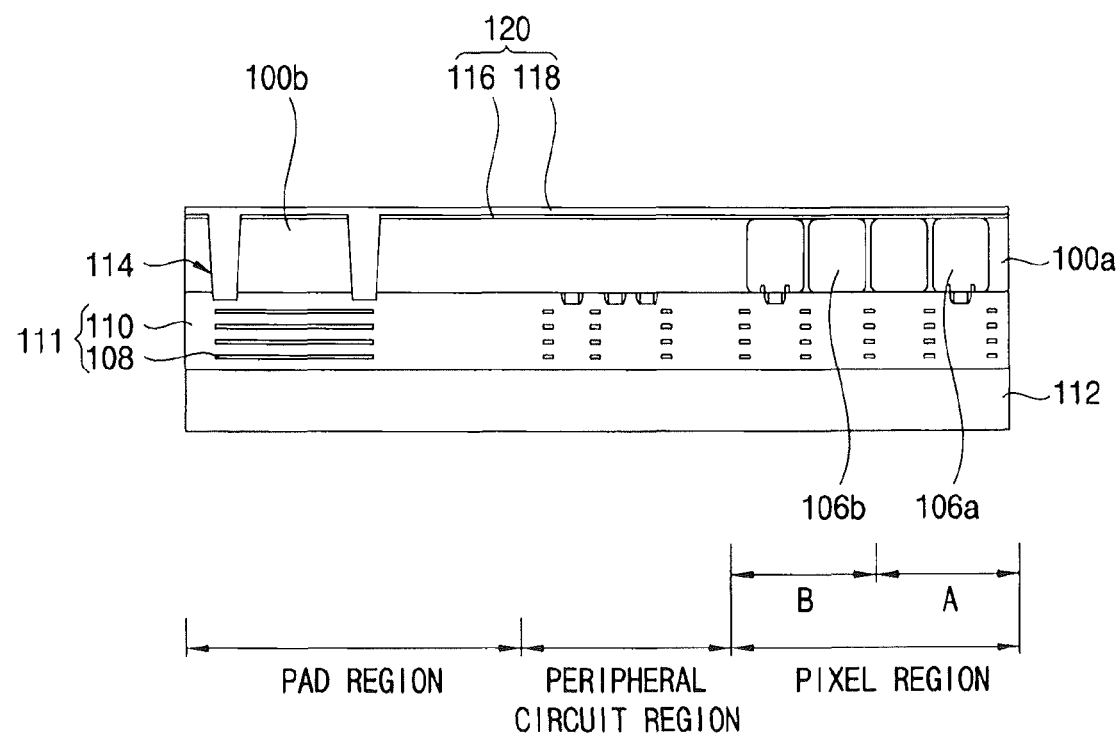

FIGS. 12A to 12C are sectional views illustrating a method of manufacturing the backside illumination image sensor illustrated in FIG. 11.

The structure illustrated in FIG. 4C may be formed by performing the processes described with reference to FIGS. 4A and 4C. Referring to FIG. 12A, the anti-reflective layer 116 may be formed to cover the entire surface of the backside of the preliminary semiconductor layer 101. The anti-reflective layer 116 may include metal oxide, such as hafnium oxide.

Referring to FIG. 12B, the first etching mask pattern may be formed on the preliminary semiconductor layer 101. The first etching mask pattern is a mask to form the via isolation trench 114. The via isolation trench 114 for exposing the insulating interlayer 110 in the insulating interlayer structure 111 may be formed by etching the anti-reflective layer 116 and the preliminary semiconductor layer 101 using the first etching mask pattern. A semiconductor layer 100a, 100b including an outer semiconductor pattern 100a and an inner semiconductor pattern 100b is formed by the etching process. The inner semiconductor pattern 100b may be isolated by the via isolation trench 114 from the outer semiconductor pattern 100a.

Since the insulating interlayer 110 in the insulating interlayer structure 111 may be slightly etched during the etching process, the bottom surface of each via isolation trench 114 may be lower than the front side of the semiconductor layer 100a, 100b.

Referring to FIG. 12C, an upper insulating pattern 118 may be formed on the anti-reflective layer 116 such that the via isolation trench 114 can be completely filled with the insulating pattern 120.

That is, the insulating layer 118 may fill the via isolation trench 114 while covering the entire backside of the semiconductor layer 100a, 100b. However, the anti-reflective layer 116 may not be formed in the via isolation trench 114.

The subsequent processes are similar to the processes described with reference to FIGS. 4F to 4J. The image sensor having the structure illustrated in FIG. 11 may be formed through the above processes. The backside illumination image sensor of some embodiments, the insulating spacer may not be provided at the sidewall of the via contact.

Figure 13:
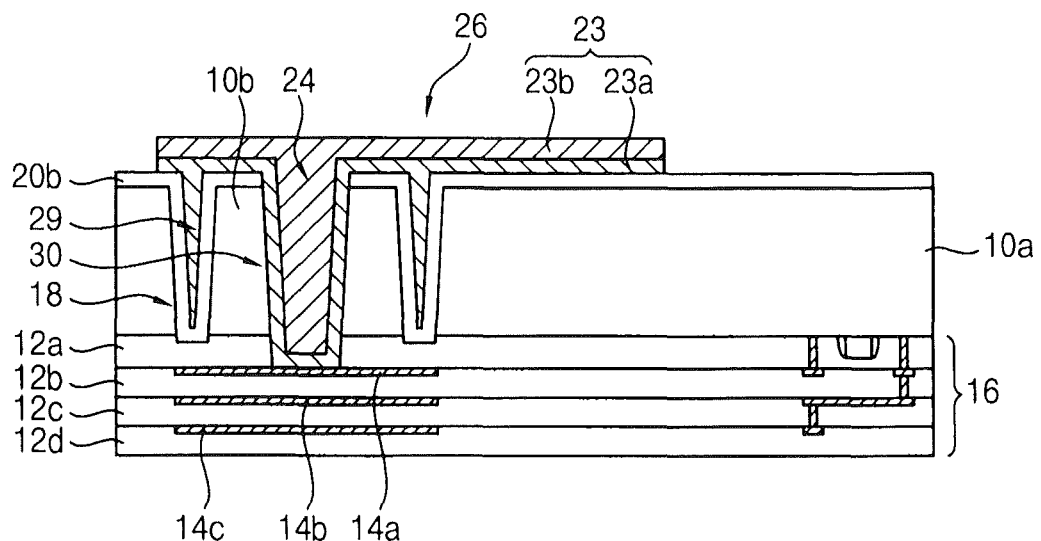
FIG. 13 is a sectional view illustrating a through silicon via structure in accordance with some embodiments.

FIG. 13 is a sectional view illustrating a through silicon via structure in accordance with some embodiments.

Referring to FIG. 13, an insulating interlayer structure 16 including insulating interlayers 12a to 12d and internal wirings 14a to 14c may be provided on the front side of the semiconductor layer. An isolation trench 18 may be formed through the semiconductor layer such that the insulating interlayer 16 can be exposed from the backside of the semiconductor layer. The semiconductor layer may include an outer semiconductor pattern 10a and an inner semiconductor pattern 10b. The inner semiconductor pattern 10b may be isolated by the via isolation trench 16 from the outer semiconductor pattern 10a.

An insulating pattern 20b extending along a profile of a sidewall and a bottom surface of the isolation trench 18 may be provided to cover an entire surface of the backside of the semiconductor layer. The insulating pattern 20b may partially fill the isolation trench 18 without completely filling up the isolation trench 18.

A via hole 30 may be formed through the inner semiconductor pattern 10b while being spaced apart from the isolation trench 18. A through silicon via contact 24 including a conductive material is provided in the via hole 30. The through silicon via contact 24 may make contact with the internal wirings 14a to 14c of the insulating interlayer structure 16. A sidewall of the through silicon via contact 24 may make direct contact with the inner semiconductor pattern 10b. The through silicon via contact 24 may include a stack structure of first and second metal layers formed by different materials.

A pad pattern 26 may extend from the through silicon via contact 24 to make contact with a surface of the insulating pattern 20b aligned at the backside of the semiconductor layer. The pad pattern 26 may have a conductive material included in the through silicon via contact 24.

A conductive pattern 29 may extend from the through silicon via contact 24 and may be provided on the insulating pattern 20b in the isolation trench 18. The conductive pattern 29 may have a conductive material included in the through silicon via contact 24. Even if the conductive pattern 29 is provided in the isolation trench 18, the through silicon via contact 24 and the pad pattern 26 may not be electrically connected to the outer semiconductor pattern 10a.

Figure 14:
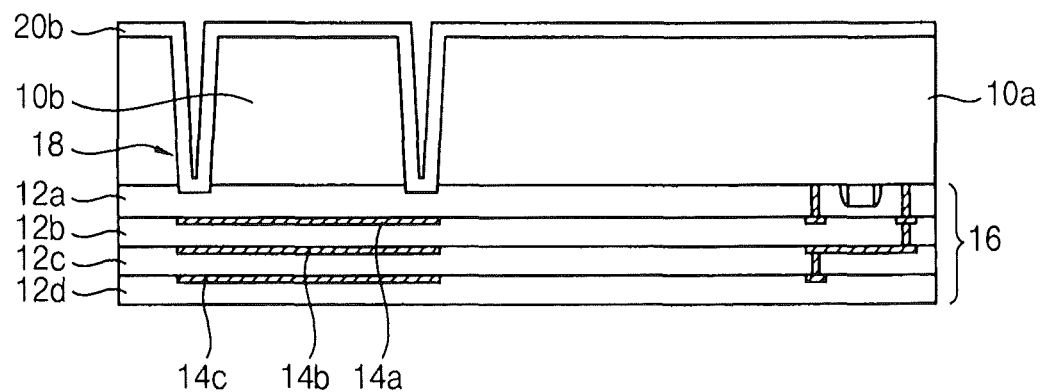
FIG. 14 is a sectional view illustrating a method of forming the through silicon via structure illustrated in FIG. 13.

FIG. 14 is a sectional view illustrating a method of forming the through silicon via structure illustrated in FIG. 13.

The structure illustrated in FIG. 2B may be formed by performing the process described with reference to FIGS. 2A and 2B. The insulating pattern 20b may be formed along the profile of the entire surface of the backside of the semiconductor layer, the sidewall of the isolation trench 18 and the bottom surface of the isolation trench 18. The insulating pattern 20b may be formed by a single insulating material. The insulating pattern 20b may be formed by stacking at least two insulating patterns. The insulating pattern 20b may be formed by using oxide such as silicon oxide or metal oxide, or nitride such as silicon nitride.

Referring again to FIG. 13, the via hole 30 exposing surfaces of the internal wirings 14a, 14b, 14c may be formed by sequentially etching the insulating pattern 20b, the inner semiconductor pattern 10b, and the insulating interlayer 12a. The via hole 30 may be aligned in the inner semiconductor pattern 10b in the isolation trench 18 and spaced apart from the isolation trench 18.

A conductive layer 23 may be formed in the via hole 30 and the isolation trench 18 as well as on the insulating pattern 20b formed on the semiconductor layer. The conductive layer 23 may include first and second metal layers 23a and 23b. Accordingly, the through silicon via contact 24 may be formed in the via hole 30. In addition, an isolation pattern filled with the insulating pattern 20b and the conductive layer pattern 29 may be formed in the isolation trench 18.

The pad pattern 26 aligned on the insulating pattern 20b and connected to the through silicon via contact 24 may be formed by patterning the conductive layer 23. Accordingly, the pad pattern 26 and the through silicon via contact 24 may include an identical conductive material.

Figure 15:
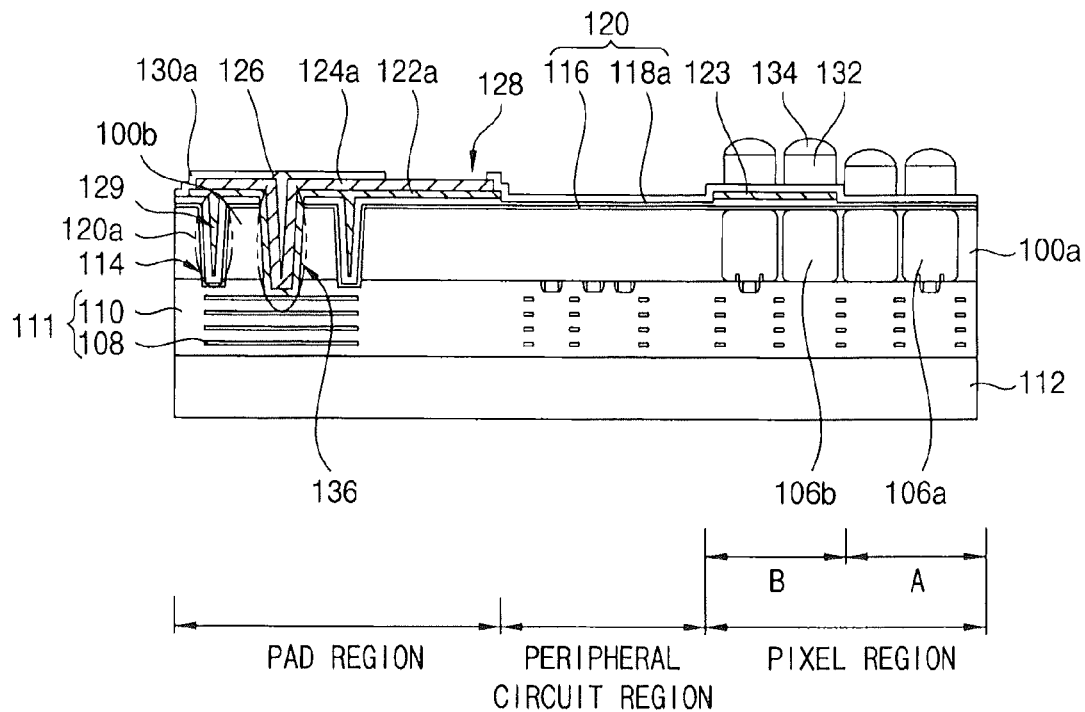
FIG. 15 is a sectional view illustrating a backside illumination image sensor in accordance with some embodiments.

Hereinafter, a backside illumination image sensor including the through silicon via structure illustrated in FIG. 13 will be described. FIG. 15 is a sectional view illustrating a backside illumination image sensor in accordance with some embodiments.

Referring to FIG. 15, the isolation trench 114 is formed through the semiconductor layer 100a to divide the inner semiconductor pattern 100b and the outer semiconductor pattern 100a.

The insulating pattern 120 may be aligned along the profile of a sidewall and a bottom surface of the isolation trench 114 while covering the entire surface of the backside of the semiconductor layer 100a, 100b. The insulating pattern 120 may not fill the isolation trench 114. The insulating pattern 120 may be formed by laminating the anti-reflective layer 116 and the insulating layer 118a. The insulating layer 118a may be an optional and may be omitted.

A via hole 136 is formed through the inner semiconductor pattern 100a while being spaced apart from the isolation trench 114. Internal wirings 108 of the insulating interlayer structure 111 may be exposed in a bottom of the via hole 136.

A through silicon via contact 126 may be provided in the via hole 136. That is, the through silicon via contact 126 may include first and second metal layers 122a and 124a. The second metal layer 124a may include a metallic material having the etch selectivity with respect to the first metal layer 122a. The second metal layer 124a may include a metallic material which has resistance lower than that of the first metal layer 122a, and has superior contact characteristic and wiring character than those of the first metal layer 122a.

The pad pattern 128 may be connected to the through silicon via contact 126 and may extend to an upper portion of the insulating pattern 120 formed on the backside of the semiconductor layer 100a, 100b. The pad pattern 128 may include the conductive material and the stacked structure identical to those of the through silicon via contact 126.

A conductive pattern 129 filling the isolation trench 114 may be aligned on the insulating pattern 120 in the isolation trench 114. The conductive pattern 129 may have a conductive material included in the through silicon via contact 126. As shown in the drawing, the conductive pattern 129 may include the first metal layer 122a.

Figure 16A:
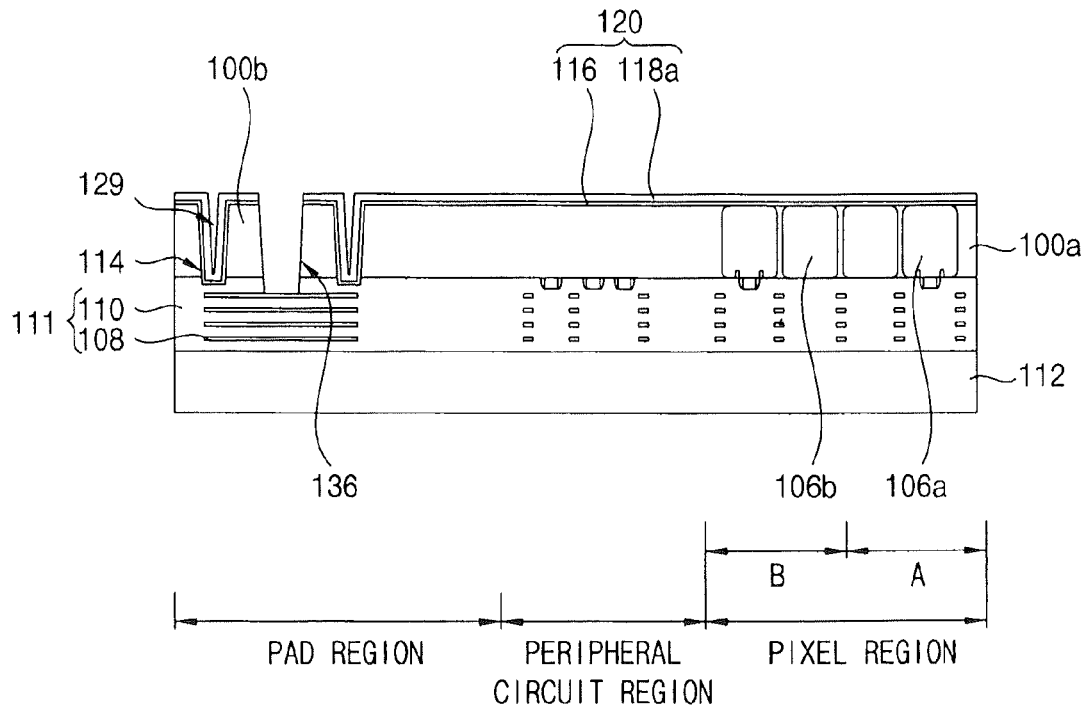
FIGS. 16A and 16B are sectional views illustrating a method of manufacturing the backside illumination image sensor illustrated in FIG. 15.
Figure 16B:
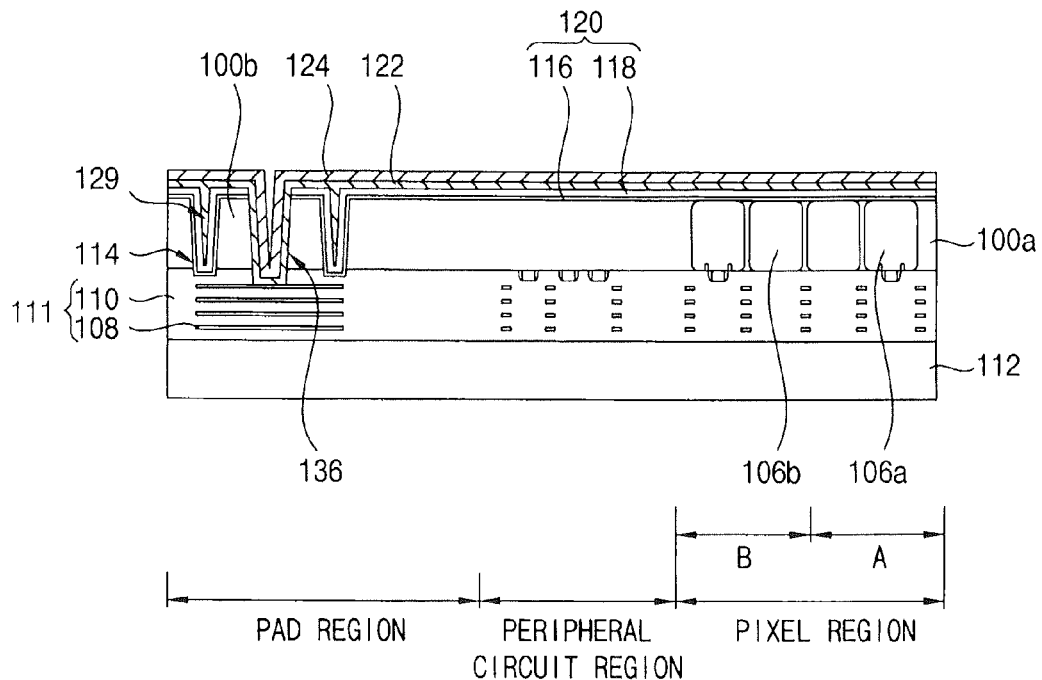

FIGS. 16A and 16B are sectional views illustrating a method of manufacturing the backside illumination image sensor illustrated in FIG. 15.

A structure illustrated in FIG. 4D may be formed by performing the processes the same as the processes described with reference to FIGS. 4A to 4D.

Referring to FIG. 16A, the insulating pattern 120 may extend along the profile of the sidewall and the bottom surface of the isolation trench 18 to cover the entire surface of the backside of the semiconductor layer 100a, 100b. The insulating pattern 120 may include the anti-reflective layer 116 and the insulating layer 118a. Because the insulating pattern 120 does not completely fills up the isolation trench 114, an opening part may be formed in the isolation trench 114.

An etching mask pattern for forming a via hole may be formed on the insulating pattern 120. The via hole 136 exposing the surface of the internal wiring 108 formed in the pad region may be formed by sequentially etching the insulating pattern 120, the inner semiconductor pattern 100b, and the insulating interlayer 110 in the insulating interlayer structure 111 using the etching mask pattern.

Referring to FIG. 16B, the first metal layer 122 and the second metal layer 124 may be formed in the via hole 136, in the isolation trench 114, and on a top surface of the insulating pattern 120 formed on the semiconductor layer 100a, 100b. That is, the metal layer may be also formed in the isolation trench 114. However, since an internal width of the isolation trench 114 is narrower than that of the via hole 136, only the first metal layer 122 may be filled in the isolation trench 114.

The image sensor illustrated in FIG. 15 may be manufactured by performing subsequent processes described with reference to FIGS. 4H to 4J.

Figure 17:
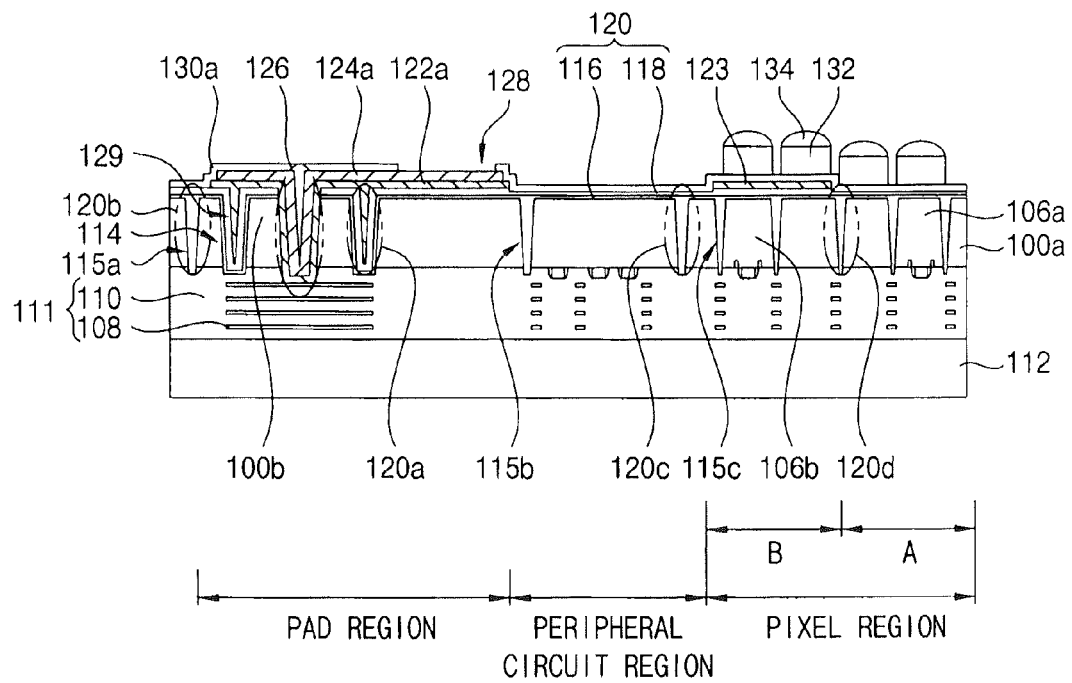
FIG. 17 is a sectional view illustrating a backside illumination image sensor in accordance with some embodiments.

FIG. 17 is a sectional view illustrating a backside illumination image sensor in accordance with another example embodiment. Referring to FIG. 17, a circuit block isolation trench 115b, a pixel isolation trench 115c, and a crack prevention trench 115a may be further provided in the semiconductor layer 100a, 100b of the backside illumination image sensor illustrated in FIG. 15.

An insulating pattern 120 may be provided in the circuit block isolation trench 115b, a pixel isolation trench 115c, and a crack prevention trench 115a.

As shown in FIG. 17, the circuit block isolation trench 115b, the pixel isolation trench 115c, and the crack prevention trench 115a may be all provided in the semiconductor layer 100a, 100b. However, in some embodiments, at least one of the circuit block isolation trench 115b, the pixel isolation trench 115c, and the crack prevention trench 115a may be provided.

The backside illumination image sensor illustrated in FIG. 17 may be formed through the process the same as the process described with reference to FIGS. 16A and 16B. However, when performing an etching process of forming the via isolation trench 114, the circuit block isolation trench 115b, the pixel isolation trench 115c, and the crack prevention trench 115a are simultaneously formed.

Figure 18:
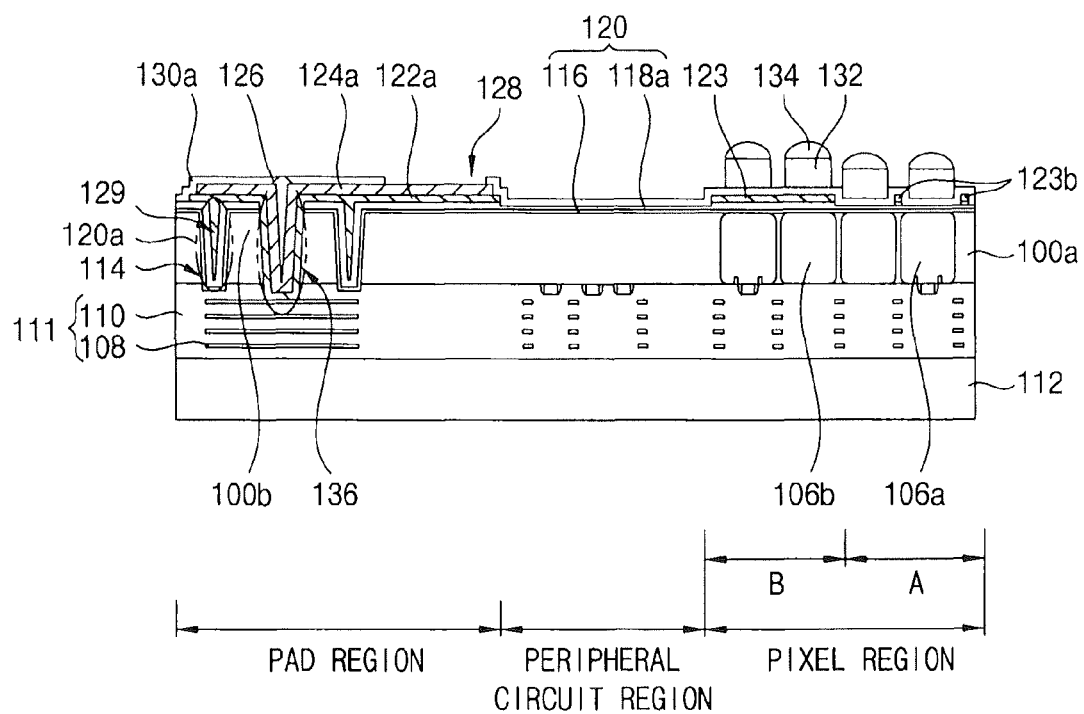
FIG. 18 is a sectional view illustrating a backside illumination image sensor in accordance with some embodiments.

FIG. 18 is a sectional view illustrating a backside illumination image sensor in accordance with some embodiments. Referring to FIG. 18, in the backside illumination image sensor, a light blocking pattern 123a and an optical crosstalk prevention pattern 123b may be provided in the backside illumination image sensor. The optical crosstalk prevention pattern 123b may be provided between first photo diodes 106a and may have a lattice shape. The light-shield pattern 123a and the optical crosstalk prevention pattern 123b may be formed by a patterning process.

Figure 19:
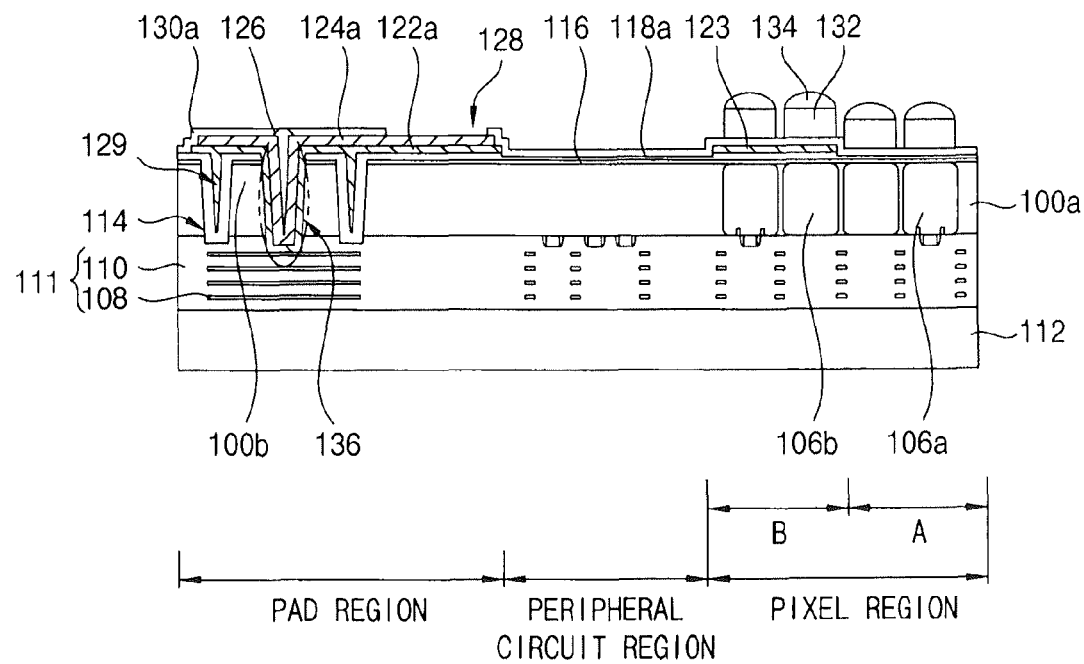
FIG. 19 is a sectional view illustrating a backside illumination image sensor in accordance with some embodiments.

FIG. 19 is a sectional view illustrating a backside illumination image sensor in accordance with some embodiments. Referring to FIG. 19, the anti-reflective layer 116 may be provided on a flat surface of the backside of the semiconductor layer 100a, 100b. That is, the anti-reflective layer 116 may not be provided in the via isolation trench 114.

The insulating layer 118a may be provided along the profile of the inner surface of the via isolation trench 114. In addition, the insulating layer 118a may be provided on the anti-reflective layer 116.

The backside illumination image sensor illustrated in FIG. 19 may be manufactured through following processes.

A structure illustrated in FIG. 12C may be formed by performing the process the same as the process described with reference to FIGS. 12A to 12C. An etching mask pattern for forming a via hole may be formed. The via hole 136 exposing the surface of the internal wiring 108 formed in the pad region may be formed by sequentially etching the insulating pattern 120, the anti-reflective layer 116, the inner semiconductor pattern 100b, and the insulating interlayer 110 in the insulating interlayer structure 111 using the etching mask pattern. The image sensor having the structure illustrated in FIG. 19 may be manufactured by performing the process described with reference to FIG. 14B.

Figure 20:
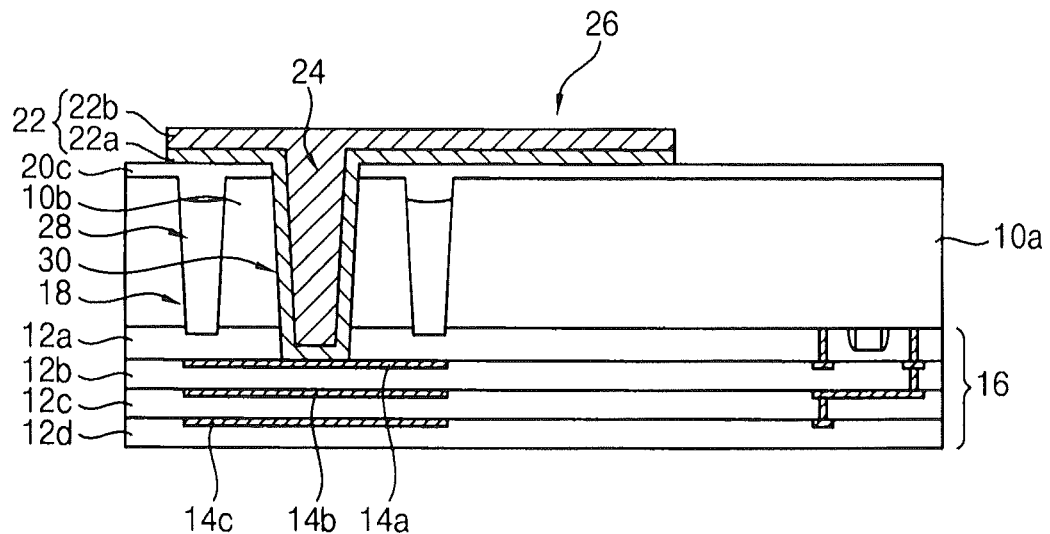
FIG. 20 is a sectional view illustrating a through silicon via structure in accordance with some embodiments.

FIG. 20 is a sectional view illustrating a through silicon via structure in accordance with a third example embodiment.

Referring to FIG. 20, the insulating interlayer structure 16 including the insulating interlayers 12a to 12d and internal wirings 14a to 14c may be provided on the front side of the semiconductor layer. The isolation trench 18 may be formed through the semiconductor layer so that the insulating interlayer structure 16 may be exposed from the backside of the semiconductor layer. The semiconductor layer may include an inner semiconductor pattern 10b in the isolation trench 18 and an outer semiconductor pattern 10a.

An insulating pattern 20c may be provided on an entire top surface of the backside of the semiconductor layer while covering an inlet part of the isolation trench 18. A portion of the insulating pattern 20c may plug an opening of the isolation trench 18, which is defined by the surface of the backside of the semiconductor layer, to form a void 28 in the isolation trench 18. The insulating pattern 20c may be formed only at an upper sidewall of the isolation trench 18, so the insulating pattern 20c blocks only the inlet part of the isolation trench 18. Accordingly, the insulating pattern may be not provided at a lower sidewall and a bottom surface of the isolation trench 18. The void 28 may be an air gap and it may electrically insulate the through silicon via contact 24 and the pad pattern 26 from the outer semiconductor pattern.

A via hole 30 is formed through the inner semiconductor pattern 10b while being spaced apart from the isolation trench.

The through silicon via contact 24 including a conductive material is provided in the via hole 30. The through silicon via contact 24 may make contact with internal wirings 14a to 14c of the insulating interlayer structure 16. A sidewall of the through silicon via contact 24 may make direct contact with the inner semiconductor pattern 10b. The through silicon via contact 24 may have a stack structure of the first and second metal layers 22a and 22b.

The pad pattern 26 may extend from the through silicon via contact 24 and may be formed on a surface of the insulating pattern 20c aligned on the backside of the semiconductor layer. The pad pattern 26 may have a conductive material included in the through silicon via contact 24.

Figure 21:
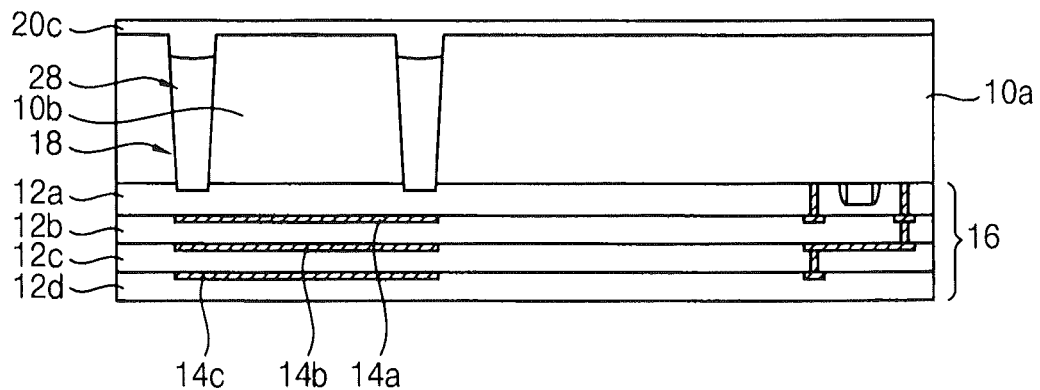
FIG. 21 is a sectional view illustrating a method of forming the through silicon via structure illustrated in FIG. 20.

FIG. 21 is a sectional view illustrating a method of forming the through silicon via structure illustrated in FIG. 20.

The structure illustrated in FIG. 2A may be formed by performing the process described with reference to FIGS. 2A and 2B. Referring to FIG. 21, the insulating pattern 20c may be formed to cover an entire surface of the backside of the semiconductor layer and the inlet part of the isolation trench 18. As illustrated in FIG. 21, the insulating pattern 20c may block the inlet part of the isolation trench 18 while forming an air gap 28 in the isolation trench 18. The insulating pattern 20c may include a single insulating material. The insulating pattern 20b may be formed by stacking at least two insulating patterns. The insulating pattern 20c may include oxide such as silicon oxide or metal oxide or nitride such as silicon nitride.

After that, the through via contact structure shown in FIG. 20 may be formed by performing the process described with reference to FIG. 2D.

Figure 22:
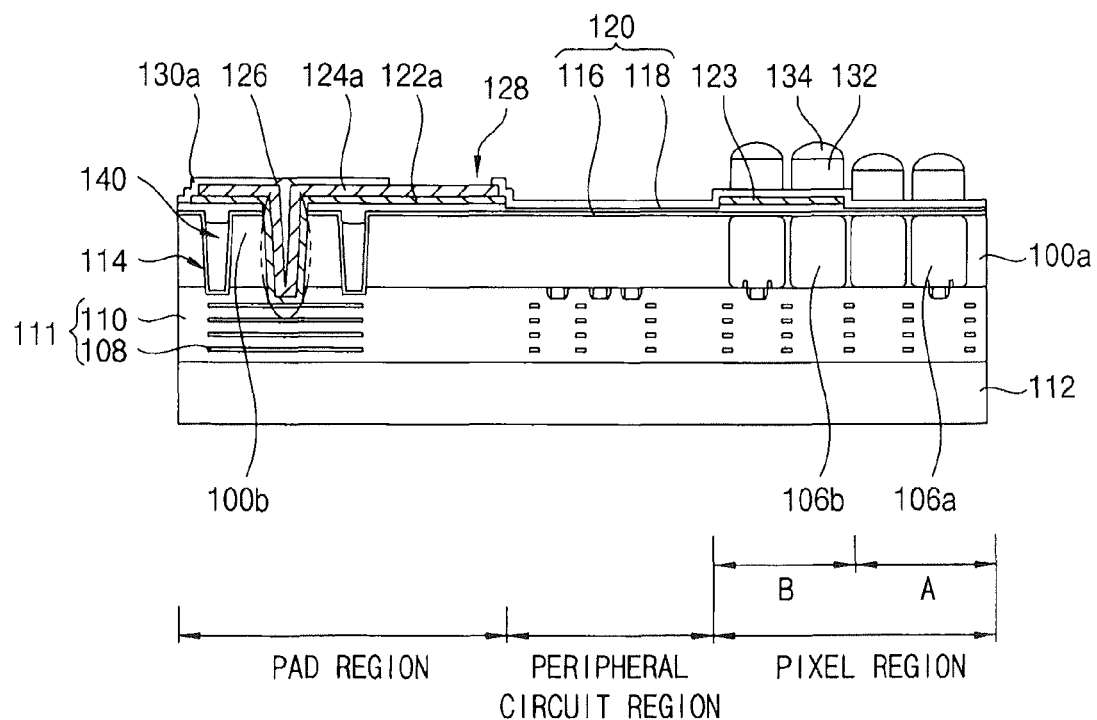
FIG. 22 is a sectional view illustrating a backside illumination image sensor in accordance with some embodiments.

Hereinafter, backside illumination image sensors including the through silicon via structure shown in FIG. 20 will be explained. FIG. 22 is a sectional view illustrating the backside illumination image sensor in accordance with some embodiments. Referring to FIG. 22, the isolation trench 114 is formed through the semiconductor layer 100a, 100b to divide the inner semiconductor pattern 100b and the outer semiconductor pattern 100a.

The insulating pattern 120 having a shape of covering the entire surface of the backside of the semiconductor layer 100a, 100b and the inlet part of the isolation trench 114 may be provided. The insulating pattern 120 may be provided in an upper sidewall of the isolation trench 114 to block the inlet part of the isolation trench 114 and to form the air gap in the isolation trench 114. The insulating pattern 120 may be formed by laminating the anti-reflective layer 116 and the insulating layer 118.

For example, as illustrated in the drawing, the anti-reflective layer 116 may be formed along the sidewall and the bottom surface of the isolation trench 114. The insulating layer 118 may be formed only at the inlet part of the isolation trench 114 to block the inlet part of the isolation trench 114.

The insulating layer 118 may be omitted and only the anti-reflective layer 116 may be formed in the inlet part of the isolation trench 114 to block the inlet part of the isolation trench 114.

Figure 23:
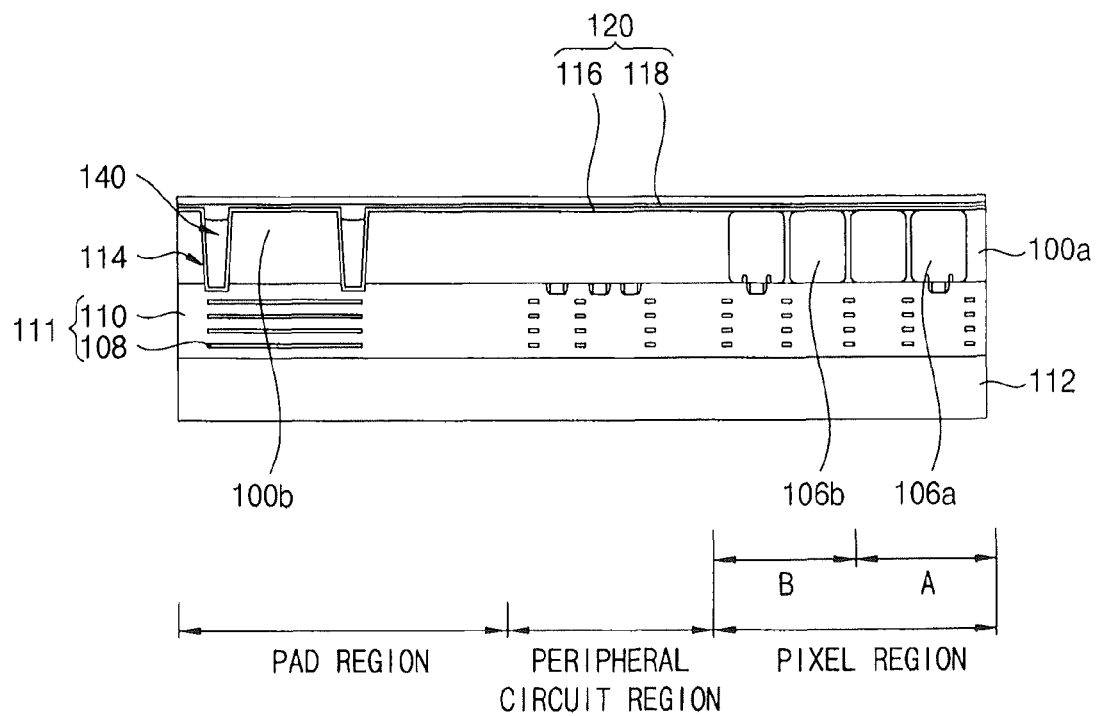
FIG. 23 is a sectional view illustrating a method of manufacturing the backside illumination image sensor illustrated in FIG. 22.

FIG. 23 is a sectional view illustrating a method of manufacturing the backside illumination image sensor illustrated in FIG. 22.

The structure illustrated in FIG. 4D may be formed by performing the process described with reference to FIGS. 4A to 4D. Referring to FIG. 23, an insulating pattern 120 covering the inlet part of the isolation trench 114 as well as the front side of the semiconductor layer 100a, 100b may be formed. An air gap 140 is formed in the isolation trench 114 located in a lower portion of the insulating pattern. The insulating pattern 120 may include an anti-reflective layer 116 and an insulating layer 118.

The anti-reflective layer 116 may be formed along a sidewall and a bottom surface of the isolation trench 114. The insulating layer may be formed only in the inlet part of the isolation trench 114 to block the inlet part of the isolation trench 114. Meanwhile, the insulating pattern 120 may be formed by using only the anti-reflective layer 116. In this case, only the anti-reflective layer 116 may be form in the inlet part of the isolation trench 114 to block the inlet part of the isolation trench 114.

The image sensor illustrated in FIG. 22 may be manufactured by performing subsequent processes described with reference to FIGS. 4F to 4J.

Figure 24:
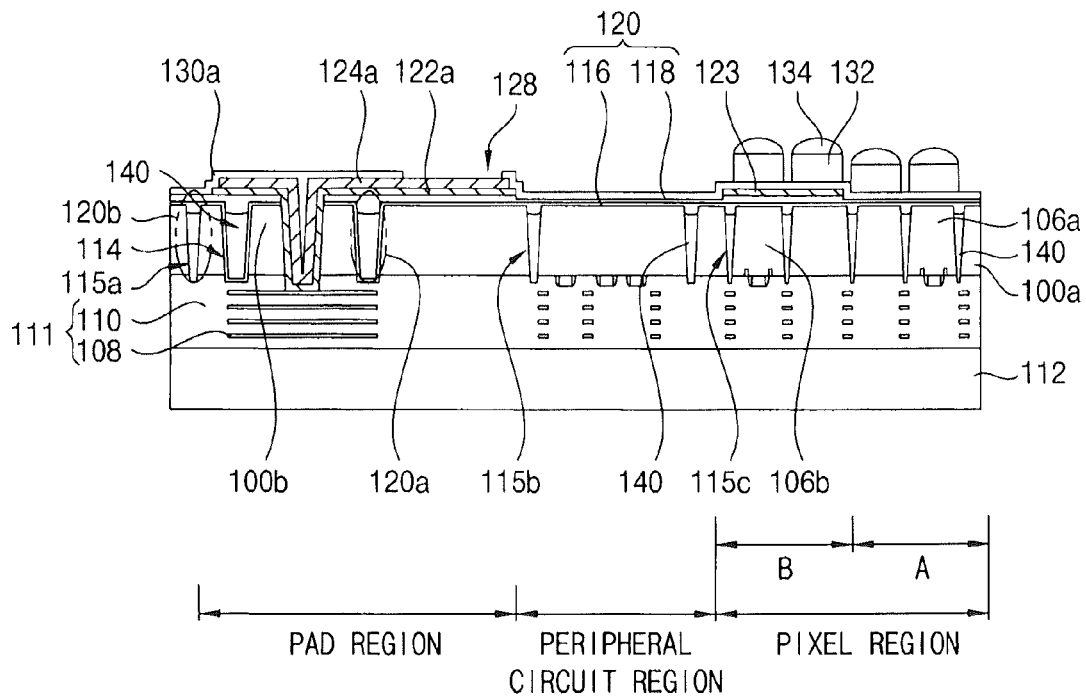
FIG. 24 is a sectional view illustrating a backside illumination image sensor in accordance with some embodiments.

FIG. 24 is a sectional view illustrating a backside illumination image sensor in accordance with another example embodiment. Referring to FIG. 24, a circuit block isolation trench 115b, a pixel isolation trench 115c, and a crack prevention trench 115a may be further provided in the semiconductor layer 100a, 100b of the backside illumination image sensor illustrated in FIG. 22. The trenches 115a to 115c have the locations, shapes, and functions the same as those of trenches described with reference to FIG. 6.

The insulating pattern 120 has a shape of covering inlet parts the via isolation trench 114, the circuit block isolation trench 115b, the pixel isolation trench 115c, and the crack prevention trench 115a, while covering the entire surface of the backside of the semiconductor layer 100a, 100b. That is, the air gap 140 is formed in the via isolation trench 114, the circuit block isolation trench 115b, the pixel isolation trench 115c, and the crack prevention trench 115a.

The backside illumination image sensor illustrated in FIG. 24 may be formed by the process the same as the process described with reference to FIG. 23. However, when performing an etching process of forming the via isolation trench 114, the circuit block isolation trench 115b, the pixel isolation trench 115c, and the crack prevention trench 115a may be simultaneously formed.

The image sensor may include the circuit block device trench 115b on a semiconductor layer to prevent interference and noise between unit circuits. The pixel isolation trench 115c may be provided on the semiconductor layer so that optical crosstalk between the pixels can be suppressed. The crack prevention trench 115a may be provided on the semiconductor layer so that crack occurring in the sawing process to package the image sensor may not occur.

Figure 25:
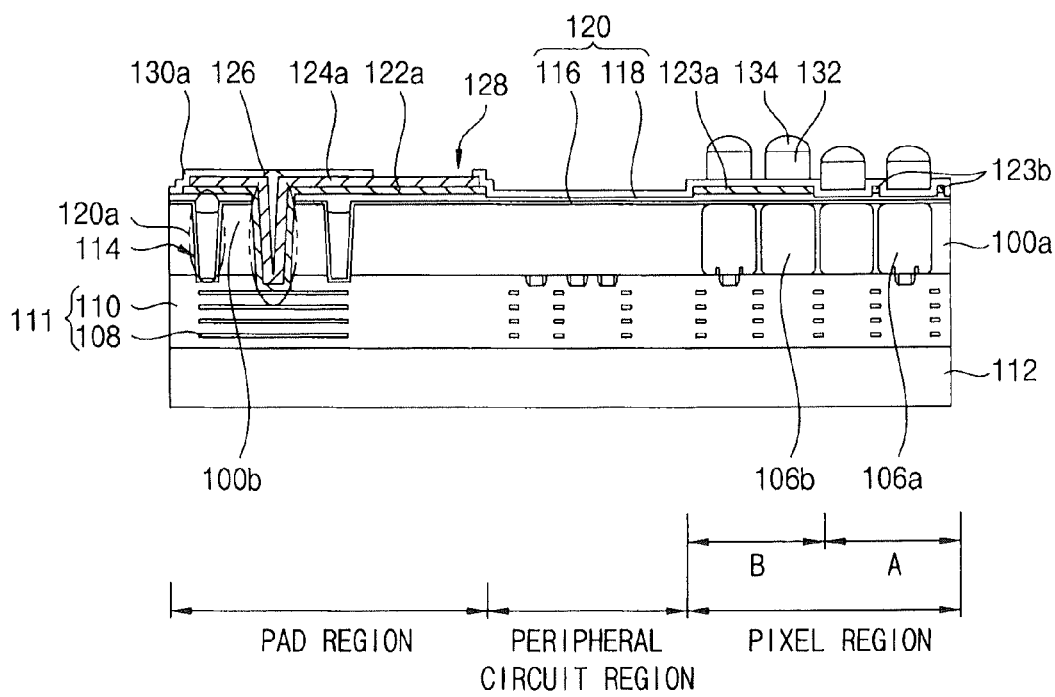
FIG. 25 is a sectional view illustrating a backside illumination image sensor in accordance with some embodiments.

FIG. 25 is a sectional view illustrating a backside illumination image sensor in accordance with some embodiments.

Referring to FIG. 25, in the backside illumination image sensor illustrated in FIG. 22, a light blocking pattern 123a and an optical crosstalk prevention pattern 123b are provided on the top surface of the insulating pattern 120. The optical crosstalk prevention pattern 123b may be provided between first photo diodes 106a and may have a lattice shape. The light blocking pattern 123a and the optical crosstalk prevention pattern 123b are the same as those described with reference to FIG. 8.

The backside illumination image sensor illustrated in FIG. 25 may be formed through the process described with reference to FIG. 23. However, during a patterning process for forming the light-shield pattern 123a, the optical crosstalk prevention pattern 123b may be also formed.

The image sensor in accordance with the example embodiment may include the optical crosstalk prevention pattern to reduce the optical crosstalk between pixels.

Figure 26:
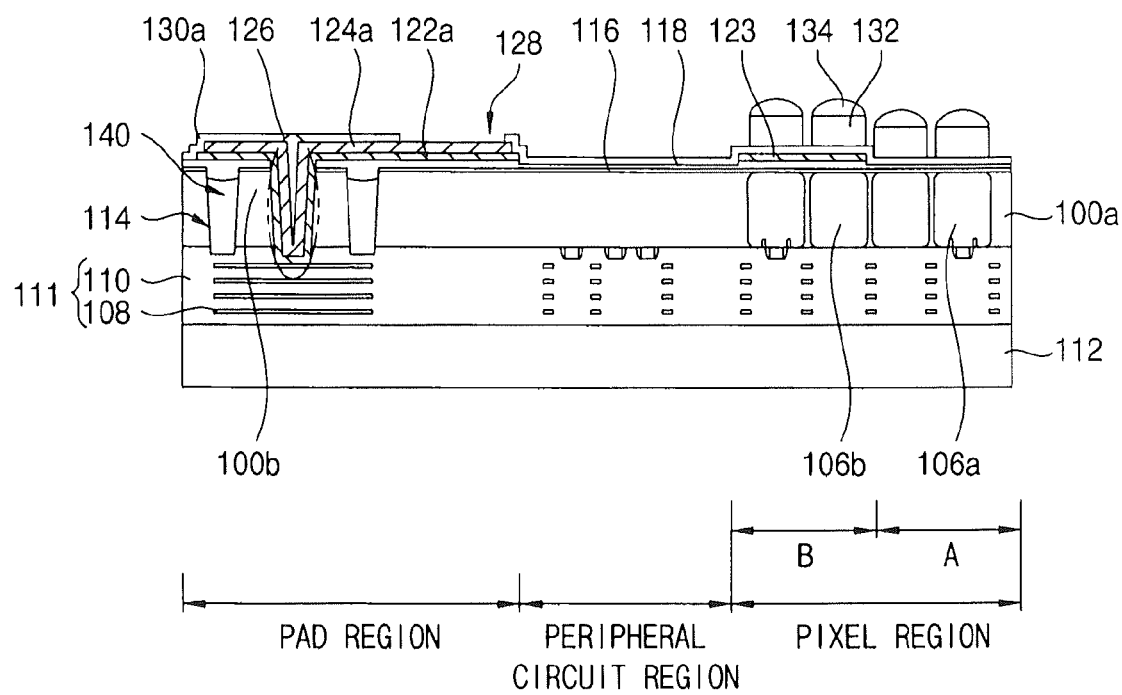
FIG. 26 is a sectional view illustrating a backside illumination image sensor in accordance with some embodiments.

FIG. 26 is a sectional view illustrating a backside illumination image sensor in accordance with another example embodiment.

The anti-reflective layer 116 may be provided on a flat surface of the backside of the semiconductor layer 100a, 100b. That is, the anti-reflective layer 116 does not block an upper portion of the inlet part of the via isolation trench 114. An upper insulating layer 118 may be formed on the anti-reflective layer 116 to cover the upper input of the inlet part of the via isolation trench 114. In this case, the insulating layer 118 may be not an optional element, but an essential element.

The backside illumination image sensor illustrated in FIG. 26 may be prepared by following processes.

The structure illustrated in FIG. 12D may be formed by performing the process described with reference to FIGS. 4A to 4C and FIGS. 12A and 12B. The insulating pattern 118 may be formed on the anti-reflective layer to cover the inlet part of the via isolation trench 114.

After that, the image sensor illustrated in FIG. 26 may be manufactured by performing subsequent processes described with reference to FIGS. 4F to 4J.

Figure 27:
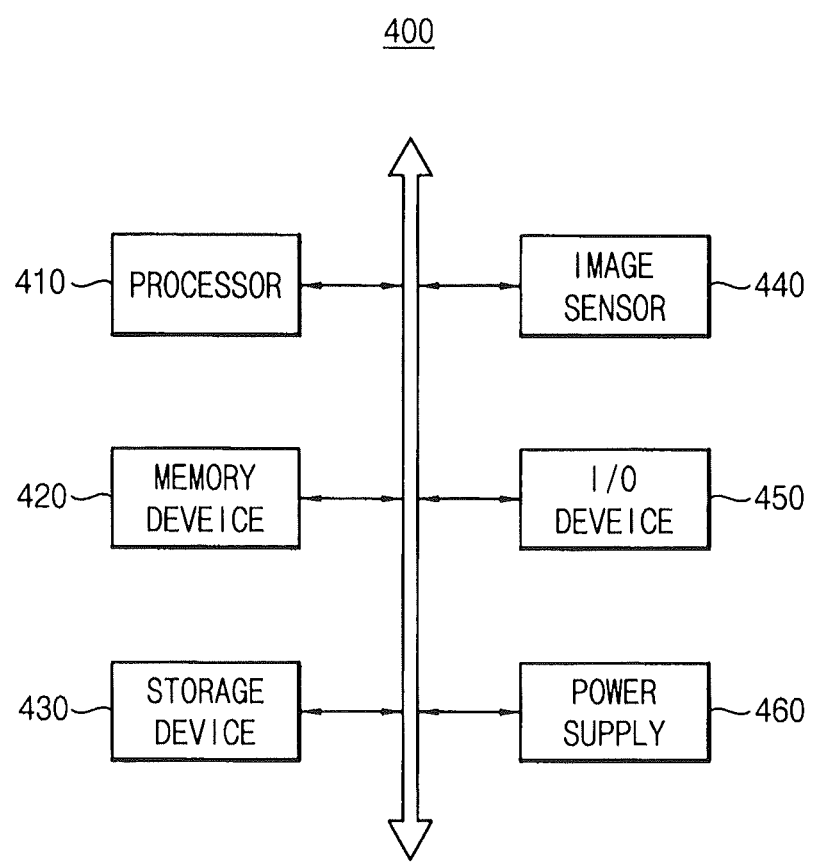
FIG. 27 is a block diagram illustrating an electronic system including an image sensor in accordance with some embodiments.

FIG. 27 is a block diagram illustrating an electronic system including an image sensor in accordance with some embodiments.

Referring to FIG. 27, the electronic system 400 may include a processor 410, a memory device 420, a storage device 430, an image sensor 440, an input/output device 450, and a power supply 460. The electronic system 400 may further include ports capable of communicating with a video card, a sound card, a memory card, a USB device, or other electronic systems.

The processor 410 may perform specific calculations or tasks. For instance, the processor 410 may include a microprocessor or a central processing Unit (CPU). The processor 410 may be connected to the memory device 420, the storage device 430, and the input/output device 450 through an address bus, a control bus, and a data bus to perform communication. According to some embodiments, the processor 410 may be connected to an extension bus such as a peripheral component interconnect (PCI) bus.

The memory device 420 may store data necessary for an operation of the electronic system 400.

The storage device 430 may include a solid state drive, a hard disk drive, and a CD-ROM. The input/output device 450 may include an input device such as a key board, a key pad, or a mouse, and an output device such as a printer or a display. The power device 460 may supply an operation voltage necessary for an operation of the electronic system 400.

The image sensor 440 may be connected to the processor 410 through the buses or other communication links to perform communication. The image sensor may include one image sensor according to some embodiments.

According to some embodiments, the image sensor 440 may be integrated in one chip together with the processor 410, or the image sensor 440 and the processor 410 may be integrated indifferent chips, respectively. The electronic system 400 may be interpreted as various systems using an image sensor.

The through silicon via structure according to some embodiments is applicable to various semiconductor devices. The backside illumination image sensor according to the example embodiments is applicable to a computer, a digital camera, a three-dimensional camera, a portable phone, a PDA, a scanner, a vehicle navigation device, a video phone, a monitoring system, an automatic focus system, a tracking system, an operation monitoring system, and an image stabilizing system.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of forming a through silicon via structure, comprising:
   forming an insulating interlayer structure including an insulating interlayer on a first side of a semiconductor layer and an internal wiring on the insulating interlayer;
   forming an outer semiconductor pattern and an inner semiconductor pattern isolated from the outer semiconductor pattern by forming an isolation trench through the semiconductor layer, the isolation trench enclosing the inner semiconductor pattern and exposing the insulating interlayer;
   forming an insulating pattern covering a second side of the semiconductor layer opposite to the first side of the semiconductor layer and an inner surface of the isolation trench;
   forming a via hole, which is spaced apart from the isolation trench and passes through the inner semiconductor pattern, wherein an upper portion of the via hole is surrounded by a portion of the insulating pattern covering the second side of the semiconductor layer; and
   forming a through silicon via contact in the via hole contacting the internal wiring.

2. The method of claim 1, wherein forming the isolation trench comprises etching a portion of the insulating interlayer to dispose a lower portion of the isolation trench in the insulating interlayer.

3. The method of claim 1, further comprising forming a pad pattern after forming the through silicon via contact, the pad pattern contacting a portion of the insulating pattern covering the second side of the semiconductor layer.

4. A method of manufacturing an image sensor, comprising:
   forming a first photodiode for an active pixel and a second photodiode for an optical black pixel in first and second regions of a semiconductor layer, respectively;
   forming an insulating interlayer structure including an insulating interlayer on a first side of the semiconductor layer and an internal wiring on the insulating interlayer;
   forming an outer semiconductor pattern and an inner semiconductor pattern isolated from the outer semiconductor pattern by forming an isolation trench through the semiconductor layer, the isolation trench enclosing the inner semiconductor pattern and exposing the insulating interlayer;
   forming an insulating pattern covering a second side of the semiconductor layer opposite to the first side of the semiconductor layer and an inner surface of the isolation trench;
   forming a through silicon via contact, which is spaced apart from the isolation trench and passes through the inner semiconductor pattern, wherein an upper portion of the through silicon via contact is surrounded by a portion of the insulating pattern covering the second side of the semiconductor layer and a lower portion of the through silicon via contact contacts the internal wiring;

forming a pad pattern on the insulating pattern covering the second side of the semiconductor layer; and forming a color filter on the insulating pattern covering the second side of the semiconductor layer and a micro lens on the color filter.

5. The method of claim 4, wherein the forming the through silicon via contact and forming the pad pattern comprises:

forming a via hole spaced apart from the isolation trench by etching through the inner semiconductor pattern and a portion of the insulating pattern covering the second side of the semiconductor layer, the via hole exposing the internal wiring;

forming a conductive layer in the via hole and on the insulating pattern covering the second side of the semiconductor layer;

forming the through silicon via contact comprising the conductive layer; and forming the pad pattern by patterning the conductive layer, which comprises the pad pattern.

6. The method of claim 5, further comprising forming a light blocking pattern on the insulating pattern in the second region of the semiconductor layer by patterning the conductive layer, which comprises the light blocking pattern.

7. The method of claim 6, wherein forming the conductive layer comprises forming a stack structure including a first metal layer and a second metal layer, which has an etch selectivity to the first metal layer.

8. The method of claim 7, wherein forming the through silicon via contact comprises forming the through silicon via contact comprising the stack structure, forming the pad pattern comprises forming the pad pattern comprising the stack structure and forming the light blocking pattern comprises forming the light blocking pattern consisting of the first metal layer.

9. The method of claim 5, wherein the first photodiode is one among a plurality of first photodiodes and the method further comprises forming an optical crosstalk prevention pattern extending on the insulating pattern and between directly adjacent two of the plurality of first photodiodes, the optical crosstalk prevention pattern comprising the conductive layer.

10. The method of claim 4, wherein the semiconductor layer comprises a peripheral circuit region including a plurality of transistors in the outer semiconductor pattern and a pad region including the inner semiconductor pattern, and the method further comprises:

forming a trench in one of a first portion of the semiconductor layer between the first region and the second region, a second portion of the semiconductor layer in the peripheral circuit region and a third portion of the semiconductor layer in the pad region; and forming a trench insulating layer in the trench.

11. A method of manufacturing an integrated circuit device, comprising:

forming an insulating interlayer structure on a first surface of a substrate, the insulating interlayer structure comprising an insulating interlayer and an internal wiring;

forming an isolation trench through the substrate to form an inner substrate, which is enclosed by the isolation trench;

forming an insulating layer in the isolation trench and on a second surface of the substrate, which is opposite to the first surface of the substrate;

forming a hole, which is spaced apart from the isolation trench and passes through a portion of the insulating layer formed on the second surface of the substrate and the inner substrate, the hole exposing the internal wiring; and forming a conductive layer in the hole and on the insulating layer formed on the second surface of the substrate.

12. The method of claim 11, wherein forming the insulating layer comprises forming a portion of the insulating layer extending between the second surface of the substrate and the conductive layer formed on the second surface of the substrate.

13. The method of claim 11, wherein forming the conductive layer comprises forming a portion of the conductive layer directly contacting the inner substrate in the hole.

14. The method of claim 11, wherein forming the insulating layer comprises forming the insulating layer conformally on an inner surface of the isolation trench.

15. The method of claim 14, wherein forming the conductive layer comprises forming the conductive layer on the insulating layer in the isolation trench.

16. The method of claim 11, wherein forming the insulating layer comprises forming a void in the isolation trench by forming the insulating layer plugging an opening of the isolation trench defined by the second surface of the substrate.

17. The method of claim 11, wherein forming the isolation trench comprises forming a lower portion of the isolation trench surrounded by the insulating interlayer.

18. The method of claim 11, further comprising forming a pad pattern after forming the conductive layer, the pad pattern comprising the conductive layer and contacting the insulating layer formed on the second surface of the substrate.

19. The method of claim 11, further comprising:

forming a first photodiode for an active pixel in a first region of the substrate, which is outside of the inner substrate;

forming a pad pattern on the insulating layer formed on the second surface of the substrate; and forming a first color filter on the insulating layer formed on the first photodiode and a first micro lens on the first color filter.

20. The method of claim 19, wherein forming the insulating layer comprises forming an anti-reflective layer and forming an upper insulating layer on the anti-reflective layer.

21. The method of claim 19, wherein forming the pad pattern comprises forming an upper conductive layer on the conductive layer, the upper conductive layer having etch selectivity to the conductive layer.

22. The method of claim 21, wherein forming the upper conductive layer comprises forming the upper conductive layer having resistance lower than that of the conductive layer.

23. The method of claim 19, further comprising:

forming a second photodiode for an optical black pixel in a second region of the substrate, which is outside of the inner substrate;

forming a second color filter on the insulating layer formed on the second photodiode and a second micro lens on the second color filter; and forming a light blocking pattern between the second color filter and the insulating layer formed on the second photodiode.

24. The method of claim 23, wherein forming the light blocking pattern comprises pattering the conductive layer, which comprises the light blocking pattern.

25. The method of claim 23, wherein forming the light blocking pattern comprises forming the light blocking pattern thinner than the pad pattern.

26. The method of claim 19, wherein the first photodiode is one among a plurality of first photodiodes and the method further comprises forming an optical crosstalk preventing pattern extending on the insulating layer and between directly adjacent ones of the plurality of first photodiodes.

27. The method of claim 26, forming the optical crosstalk preventing pattern comprises pattering the conductive layer, which comprises the optical crosstalk preventing pattern.

28. The method of claim 19, wherein the substrate comprises a peripheral circuit region comprising a plurality of transistors and a pad region comprising the inner substrate, and the method further comprises:
   forming a second photodiode for an optical black pixel in a second region of the substrate;
   forming a trench in one of a first portion of the substrate between the first region and the second region, a second portion of the substrate in the peripheral circuit region and a third portion of the substrate in the pad region, which is outside of the inner substrate; and
   forming a trench insulating layer in the trench.

29. The method of claim 28, forming the trench comprises forming the trench through the substrate.

30. The method of claim 28, wherein forming the trench insulating layer comprises forming the trench insulating layer comprising the insulating layer.

* * * * *